United States Patent [19]
Zenitani et al.

[11] Patent Number: 5,696,668
[45] Date of Patent: Dec. 9, 1997

[54] CASE UNIT FOR HOUSING PRINTED-CIRCUIT ASSEMBLIES

[75] Inventors: Hideki Zenitani; Katsuya Fujii; Yuji Yoshitake; Yoshinori Hoshino, all of Kawasaki, Japan

[73] Assignee: Fujitsu Limited, Kanagawa, Japan

[21] Appl. No.: 446,232

[22] Filed: May 22, 1995

[30] Foreign Application Priority Data

Aug. 4, 1994 [JP] Japan .................. 6-183794

[51] Int. Cl.⁶ ...................................... H05K 7/14
[52] U.S. Cl. ............... 361/802; 361/756; 361/741; 439/374; 439/377
[58] Field of Search ..................... 361/741, 747, 361/756, 759, 796, 797, 801, 802; 439/61, 64, 65, 345, 374, 377; 211/41

[56] References Cited

U.S. PATENT DOCUMENTS

| | | | |
|---|---|---|---|
| 3,810,433 | 5/1974 | Posner | 211/41 |
| 4,454,566 | 6/1984 | Coyne | 361/796 |
| 5,467,254 | 11/1995 | Brusati et al. | 361/799 |

FOREIGN PATENT DOCUMENTS

| | | |
|---|---|---|
| 61-267397 | 11/1986 | Japan . |
| 465192 | 2/1992 | Japan . |
| 4-65192 | 3/1992 | Japan . |

Primary Examiner—Leo P. Picard
Assistant Examiner—Anthony Dinkins
Attorney, Agent, or Firm—Helfgott & Karas, P.C.

[57] ABSTRACT

A case unit for housing printed-circuit assemblies includes a top plate made of metal, a bottom plate, made of metal, facing the top plate, side plates facing each other, the side plates being positioned between side portions of the top plate and the bottom plate so that a space surrounded by the top plate, the bottom plate and the side plates is formed, and guide rails, made of resin, integrated with the top plate and the bottom plate, the guide rails guiding the printed-circuit assemblies loaded into the space. Each of guide rails integrated with at least one of the top plate and the bottom plate has a guide rail body for guiding an edge of a printed-circuit assembly, the guide rail body being provided on an inner surface of a corresponding plate which is the top plate or the bottom plate, a flat member provided on an outer surface of the corresponding plate, and connecting portions occupying mounting holes formed through the corresponding plate, the connecting portions connecting the guide rail body and the flat member, so that the guide rail body is fixed on the corresponding plate by the connecting portions and the flat member.

6 Claims, 22 Drawing Sheets

CASE UNIT FOR HOUSING PRINTED-CIRCUIT ASSEMBLIES

BACKGROUND OF THE INVENTION

1. Field of the Invention

The present invention generally relates to a case unit for housing printed-circuit assemblies, and more particularly to a case unit having guide rails, made of resin, for guiding printed-circuit boards of the printed-circuit assemblies.

2. Description of the Related Art

Frame apparatuses are used for telecommunications equipment. As shown in FIG. 1, a frame apparatus 10 includes a frame body 11, loading frame units 12 and case units 13. The frame body 11 is installed on a floor. The loading frame units 12 are mounted in the frame body 11 so as to be stacked therein. The case units 13 are housed in the loading frame units 12. Each of the case units 13 is used to house printed-circuit assemblies 14. The printed-circuit assemblies 14 are lead in a direction X1 and inserted into a case unit 13 so as to be arranged in parallel to each other.

A case unit 13 has a top plate on which guide rails are fixed and a bottom plate on which guide rails are fixed, the guide rails on the top plate and on the bottom plate facing each other. The case unit 13 further has a back plate on which connectors are fixed at positions corresponding to the guide rails on the top plate and the bottom plate. Each of the printed-circuit assemblies 14 is formed of a printed-circuit board 20, electronic parts 21 mounted on the printed-circuit board 20 and a connector 22 fixed at an end of the printed-circuit board 20. Edges 20a and 20b of the printed-circuit board 20 are respectively guided by guide rails 15 and 16 fixed on the top plate and the bottom plate, and a printed-circuit assembly 14 is lead in the direction X1 and inserted into the case unit 13. The connector 22 of the printed-circuit board 14 is connected to a connector 17. The edges 20a and 20b of the printed-circuit board 20 are supported by the guide rails 15 and 16 so that the printed-circuit assembly 14 is received by the case unit 13 in a state where the printed-circuit board 20 is perpendicular to the top plate and the bottom plate of the case unit 13.

In recent years, there has been a demand that the frame apparatus described above be miniaturized. In addition, an electromagnetic interference protection for restricting a leakage of electromagnetic waves from the case unit 13 is required for the frame apparatus 10.

FIG. 2 shows an example of a conventional case unit 30.

Referring to FIG. 2, the case unit 30 has side plates 31 and 32, a top plate 33 and a bottom plate 34 all of which are made of metal. The case unit 30 further has a partition plate 35 which partitions the case unit 30 into right and left portions, a shelf plate 36 bridging between the side plate 32 and the partition plate 35 and a back plate 37 on which connectors 38 are arranged. The top plate 33, the bottom plate 34 and the shelf plate 36 are provided with air vents 41 for cooling. A lower surface of the top plate 33, an upper surface of the bottom plate 34 and both surfaces of the shelf plate 36 are mounted with guide rails 40. A detailed structure of each of the guide rails 40 is shown in FIGS. 3, 4A and 4B.

As shown in FIG. 3, edges of the air vents 41 are risen by a draw forming process using a stamping machine, so that the guide rails 40 are formed. Since the draw forming process forms the guide rails 40 on only a single side of the plate, the shelf plate 36 is formed, as shown in FIG. 5, of two metal plates 50 and 51, each of which having the guide rails 40 being formed therein by the draw forming process.

Printed-circuit assemblies 14A-1, 14A-2 and 14A-3 are inserted into the case unit 30 so as to be housed by the case unit 30. Each of the printed-circuit assemblies 14A-1, 14A-2 and 14A-3 is formed of the printed-circuit board 20A, the electronic parts 21 and the connector 22.

FIG. 6 shows another example of the case unit for housing printed-circuit assemblies.

Referring to FIG. 6, a case unit 60 has a side plate 61, a top plate 62 and a bottom plate 63 all of which are made of metal. The top plate 62 and the bottom plate 63 are respectively provided with guide rails 64 which are made of resin. Each of the: guide rails 64 has, as shown in FIG. 7, engaging clicks 65. The engaging clicks 65 are inserted in and engaged with holes 66 formed on the top plate 62, so that the guide rails 64 are fixed on the top plate 62. The guide rails 64 are also fixed on the bottom plate 63 in the same manner as on the top plate 62. The case unit 60 having the above structure houses printed-circuit assemblies 14B as shown in FIG. 6.

A case unit, made of resin, for housing printed-circuit assemblies is disclosed in Japanese Laid-Open Application No.4-65192.

The guide rails 40 in the case unit 30 shown in FIG. 2 are made of metal. For the sake of electrical insulation, insulation bands 72 must be formed, on the printed-circuit board 20A, between an area on which a printed-circuit pattern is formed and portions 70 guided by the guide rails 40, as shown in FIG. 8. Each of the insulation bands 72 has, for example, a width W1 of about 1 mm.

Thus, in a case where a height H1 of the case unit 30 is fixed, the width W2 of the area 71 on which the printed-circuit pattern is formed on the printed-circuit board 20A is decreased due to the widths W1 of the insulation bands 72. Although the width W1 of each of the insulation bands 72 is small (e.g. about 1 mm), in a case where a large number of printed-circuit assemblies is housed in the frame apparatus, the total amount of widths W1 of the insulation bands 70 of the printed-circuit boards 20A may be large.

In addition, since the edges of the air vents 41 are risen by the draw forming process using the stamping machine so that the guide rails 40 are formed, each of the air vents 41 must have a sufficient length to form a guide rail. As a result, a shielding ability of the electromagnetic shield deteriorates.

Furthermore, the shelf plate 36 has a structure in which two metal plates 50 and 51 are stacked as shown in FIG. 5. Thus, a thickness t1 of the shelf plate 36 is greater than that of another plate in the case unit 30. As a result, the height of the space for the printed-circuit assemblies is reduced by the thickness t1 of the shelf plate 36.

In the case unit 60 shown in FIG. 6, since the guide rails are made of resin which is an insulator, it is not necessary to form the insulation bands, as shown in FIG. 8, on the printed-circuit board. However, since the engaging clicks 65 project upward from the top plate 62 and project downward from the bottom plate 63, the height of the case unit 60 is increased. The length of a portion of each of the engaging clicks 65 which portion projects from the top plate 62 or the bottom plate 63 is about 5 mm. Thus, it is difficult to decrease the height of the case unit 60.

Each of the shelf plates is formed of two metal plates on which the guide rails 64 are fixed by the engaging clicks 65, the metal plates being back-to-back. Since the engaging clicks 65 project from the metal plates, the thickness of the shelf plate is increased. As a result, the height of the space for the printed-circuit assemblies is reduced.

In the case unit made of resin as disclosed in Japanese Laid Open Patent Application No.4-65192, there may be a case where the case unit is deformed by the creeping inherent in resin materials. Thus, this case unit is not suitable for densely housing a large number of printed-circuit assemblies.

SUMMARY OF THE INVENTION

Accordingly, a general object of the present invention is to provide a novel and useful case unit for housing printed-circuit assemblies in which the disadvantages of the aforementioned prior art are eliminated.

A more specific object of the present invention is to provide a case unit for housing printed-circuit assemblies a height of which case unit may be lowered.

The above objects of the present invention are achieved by a case unit comprising a top plate made of metal, a bottom plate, made of metal, facing the top plate, side plates facing each other, the side plates being positioned between side portions of the top plate and the bottom plate so that a space surrounded by the top plate, the bottom plate and the side plates is formed, and guide rails, made of resin, integrated with the top plate and the bottom plate, the guide rails guiding the printed-circuit assemblies loaded into the space, each of guide rails integrated with at least one of the top plate and the bottom plate having a guide rail body for guiding an edge of a printed-circuit assembly, the guide rail body being provided on an inner surface of a corresponding plate which is the top plate or the bottom plate, a flat member provided on an outer surface of the corresponding plate, and connecting portions occupying mounting holes formed through the corresponding plate, the connecting portions connecting the guide rail body and the flat member, so that the guide rail body is fixed on the corresponding plate by the connecting portions and the flat member.

Each of the guide rails may have a guide rail body for guiding an edge of a printed-circuit assembly, the guide rail body being provided on an inner surface of a corresponding plate which is the top plate or the bottom plate, and pins projecting from the guide rail body, the pins occupying mounting holes formed through the corresponding plate, the mounting holes being tapered from an outer surface of the corresponding plate to the inner surface thereof, so that the guide rail body is fixed on the corresponding plate by the pins.

Each of the guide rails may have a guide rail body for guiding an edge of a printed-circuit assembly, the guide rail being provided on an inner surface of a corresponding plate which is the top plate or the bottom plate, and flat-headed pins projecting from the guide rail body and passing through mounting holes formed through the corresponding plate, the flat-headed pins having flat heads which are on an outer surface of the corresponding plate, so that the guide rail body is fixed by the flat-headed pins.

Each of the guide rails may have a pair of ribs arranged at a predetermined interval on an inner surface of a corresponding plate which is the top plate or the bottom plate, a guide groove for guiding a printed-circuit assembly being formed between the pair of ribs, flat members provided on an outer surface of the corresponding plate, and connecting portions occupying mounting holes formed through the corresponding plate, the connecting portions connecting the pair of ribs and the flat members, so that the pair of ribs are fixed on the corresponding plate by the connecting portions and the flat members.

Each of the guide rails may have a pair of ribs arranged at a predetermined interval on an inner surface of a corresponding plate which is the top plate or the bottom plate, a guide groove for guiding a printed-circuit assembly being formed between the pair of ribs, and pins projecting from the pair of ribs, the pins occupying mounting holes formed through the corresponding plate, each of the mounting holes being tapered from an outer surface of the corresponding plate to the inner surface thereof, so that the pair of ribs are fixed on the corresponding plate by the pins.

Each of the guide rails may have a pair of ribs arranged at a predetermined interval on an inner surface of a corresponding plate which is the top plate or the bottom plate, a guide groove for guiding a printed-circuit assembly being formed between the pair of ribs, and flat-headed pins projecting from the pair of ribs and passing through mounting holes formed through the corresponding plate, the flat-headed pins having flat heads which are on an outer surface of the corresponding plate, so that the pair of ribs are fixed by the flat-headed pins.

The above objects of the present invention are also achieved by a case unit comprising a top plate made of metals, a bottom plate, made of metal, facing the top plate, side plates facing each other, the side plates being positioned between side portions of the top plate and the bottom plate so that a space surrounded by the top plate, the bottom plate and the side plates is formed, a shelf plate, made of metal, located between the top plate and the bottom plate so as to divide the space into an upper space and a lower space, first guide rails, made of resin, integrated with the top plate and the bottom plate, and second guide rails, made of resin, integrated with the shelf plate, each of the second guide rails having an upper guide rail body provided on a first surface of the shelf plate, the upper guide rail body and at least one of the first guide rails integrated with the top plate guiding a printed-circuit assembly loaded into the upper space, a lower guide rail body provided on a second surface of the shelf plate, the lower guide rail body and at least one of the first guide rails integrated with the bottom plate guiding a printed-circuit assembly loaded into the lower space, and connection portions occupying mounting holes formed through the shelf plate, the connecting portions connecting the upper guide rail body and the lower guide rail body, so that the upper guide rail body and the lower guide rail body are fixed on the shelf plate.

Each of the second guide rails may have a first pair of ribs provided on a first surface of the shelf plate, at least one of the first guide rails integrated with the top plate and a first guide groove which is formed between the first pair of ribs guiding a printed-circuit assembly loaded into the first space, a second pair of ribs provided on a second surface of the shelf plate, at least one of the first guide rails integrated with the bottom plate and a second guide groove which is formed between the second pair of ribs guiding a printed-circuit assembly loaded into the second space, and connection portions occupying mounting holes formed through the shelf plate, the connecting portions connecting the first pair of ribs and the second pair of ribs, so that the first and second pairs of ribs are fixed on the shelf plate.

The above objects of the present invention are also achieved by a case unit comprising a top plate made of metals, a bottom plate, made of metal, facing the top plate, side plates facing each other, the side plates being positioned between side portions of the top plate and the bottom plate so that a space surrounded by the top plate, the bottom plate and the side plates is formed, and guide rails, made of resin, integrated with the top plate and the bottom plate, the guide rails guiding edges of the printed-circuit assemblies loaded into the space, each of guide rails integrated with at least one of the top plate and the bottom plate having a pair of ring-shaped ribs integrated with a corresponding plate which is the top plate or the bottom plate so as to cover edges of wide holes which are formed through the corresponding plate as air vents, the pair of ring-shaped ribs having first projection portions projecting from an inner surface of the corresponding plate and second projection portions projecting from an outer surface of the corresponding plate, the first projection portions being longer than the second projection portions, a guide groove being formed between the first projection portions of the pair of ring-shaped ribs.

The above objects of the present invention are also achieved by a case unit comprising a top plate made of metals, a bottom plate, made of metal, facing the top plate, side plates facing each other, the side plates being positioned between side portions of the top plate and the bottom plate so that a space surrounded by the top plate, the bottom plate and the side plates is formed, a shelf plate, made of metal, located between the top plate and the bottom plate so as to divide the space into an upper space and a lower space, first guide rails, made of resin, integrated with the top plate and the bottom plate, and second guide rails, made of resin, integrated with the shelf plate, each of the second guide rails having a pair of ring-shaped ribs integrated with the shelf plate so as to cover edges of wide holes which are formed through the shelf plate as air vents, the pair of ring-shaped ribs having first projection portions projecting from a first surface of the shelf plate and second projection portions projecting from a second surface of the shelf plate, a first guide groove being formed between said first projection portions of the pair of ring-shaped ribs, a second guide groove being formed between the second projection portions of the pair of ring-shaped ribs, the first guide groove and at least one of the first guide rails integrated with the top plate guiding a printed-circuit assembly loaded into the first space, the second guide groove and at least one of the first guide rails integrated with the bottom plate guiding a printed-circuit assembly loaded into the second space.

According to the present invention, guide rails made of resin can be fixed on the top plate, the bottom plate and the shelf plate without large projections from the respective plate, so that the height of the case unit can be lowered.

BRIEF DESCRIPTION OF THE DRAWINGS

Other objects, features and advantages of the present invention will become apparent from the following detailed description when read in conjunction with the accompanying drawings, in which.

DESCRIPTION OF THE PREFERRED EMBODIMENTS

A description will given of a first embodiment of the present invention.

Figure 9:
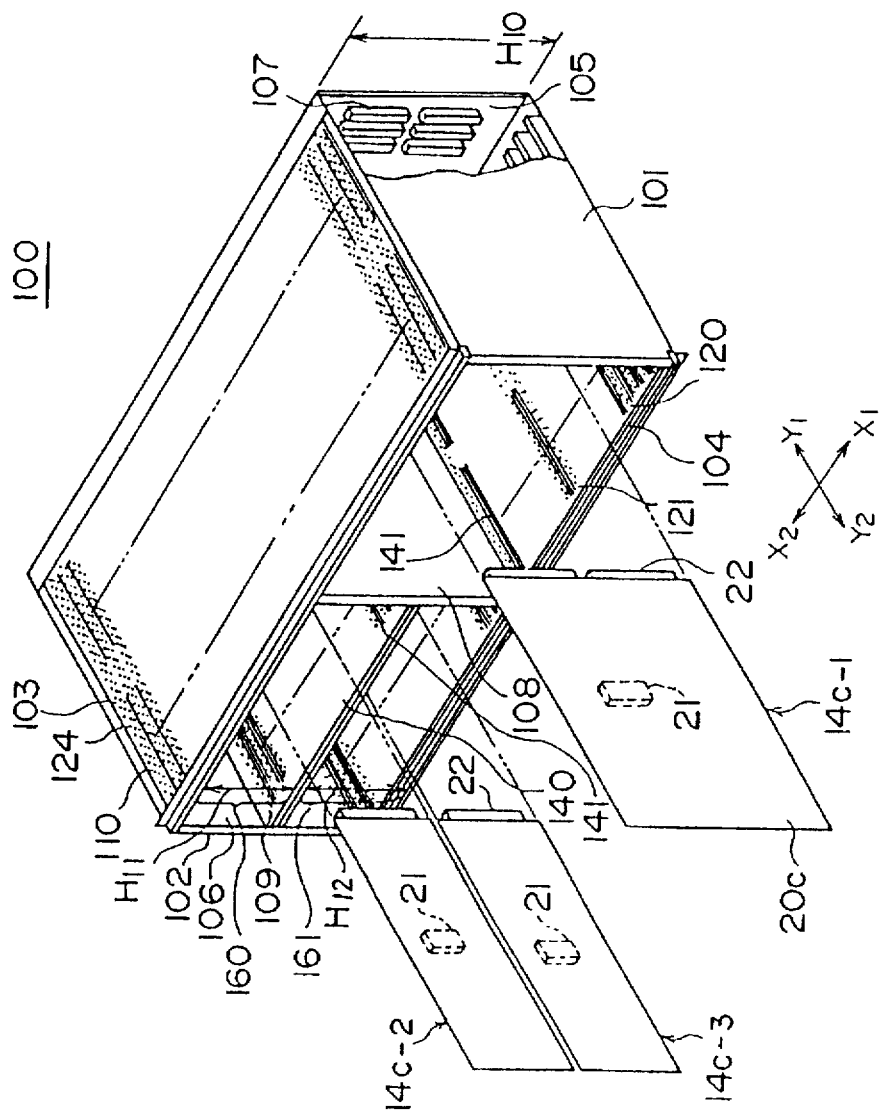
FIG. 9 is a diagram illustrating a case unit for housing printed-circuit assemblies according to a first embodiment of the present invention.

A case unit for housing printed-circuit assemblies according to the first embodiment of the present invention is formed as shown in FIG. 9. Referring to FIG. 9, a case unit 100 has side plates 101 and 102, a top plate 103 and a bottom plate 104 all of which are made of metal. The case unit 100 further has a back plate 105. A thickness of each of the side plates 101 and 102, the top plate 103 and the bottom plate 104 is about 0.5 mm. The front side of the case unit 100 is opened so that an inlet 106 through which printed-circuit assemblies are inserted is formed. A plurality of connectors 107 are mounted on an inner surface of the back plate 105 in a predetermined arrangement.

A space in the case unit 100 is segmented by a partition plate 108 into a right portion and a left portion. In the left portion, a shelf plate 109 is fixed between the side plate 102 and the partition plate 108. Many air vents 110 are formed on the top plate 103, the bottom plate 104 and the shelf plate 109 for ventilation. Each of the air vents 110 is a round hole having a diameter of a few millimeters.

The bottom plate 104 is formed as shown in FIGS. 10, 11A, 11B and 11C.

Figure 10:
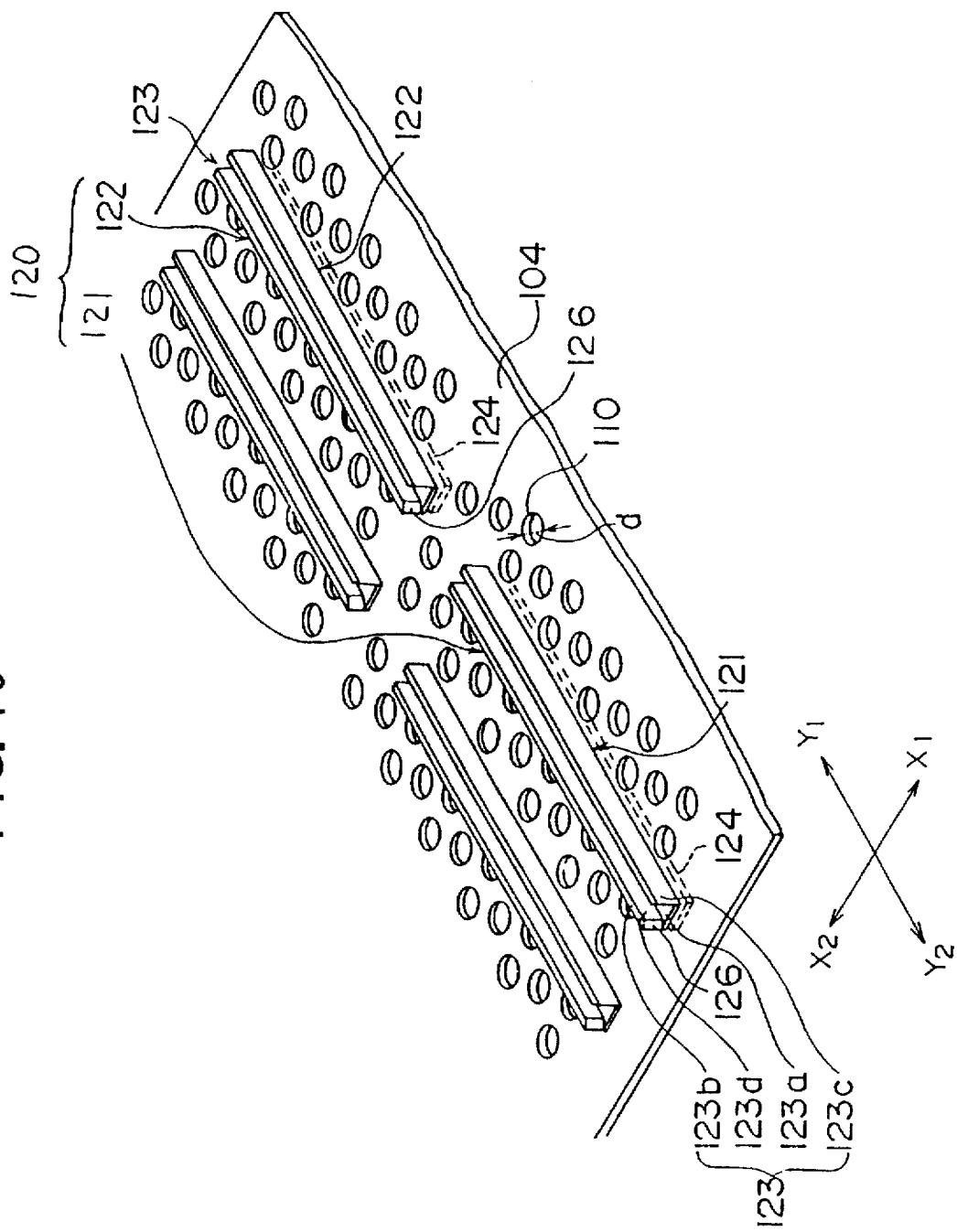
FIG. 10 is a perspective view illustrating guide rails provided on a bottom plate.

Referring to FIG. 10, guide rails 120 are fixed at predetermined positions on an inner surface of the bottom plate 104. The guide rails 120 include first guide rails 121 which are on the side near the inlet 106 and second guide rails 122 which are on the side near the back plate 105. Each of the first guide rails 122 and a corresponding one of the second guide rails 122 are arranged in a Y1–Y2 direction parallel to the side plates 101 and 102.

Figure 11A:
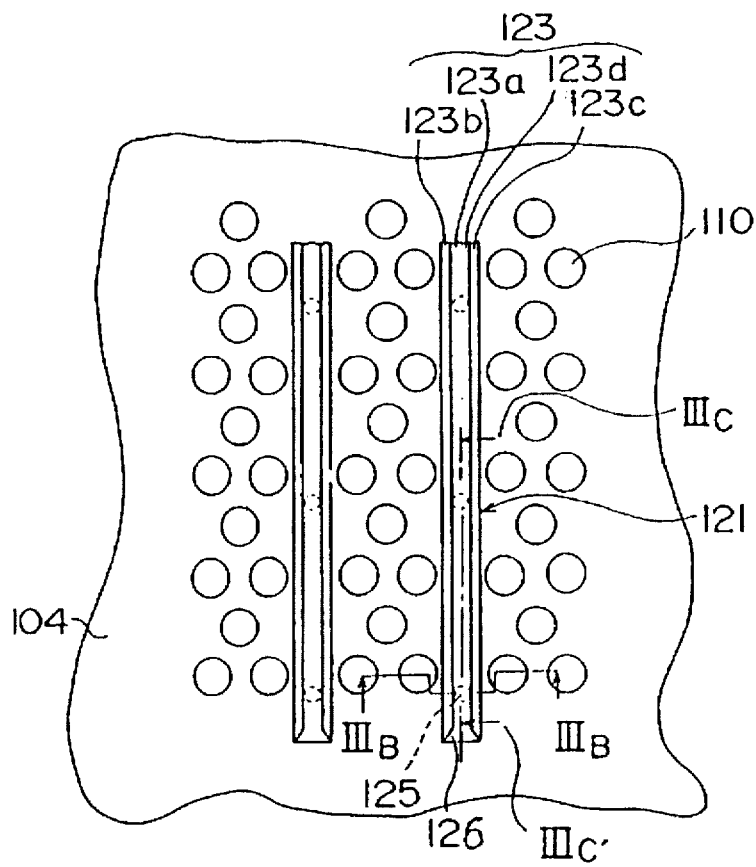
FIG. 11A is a diagram illustrating guide rails fixed on a bottom plate shown in FIG. 9.
Figure 11B:
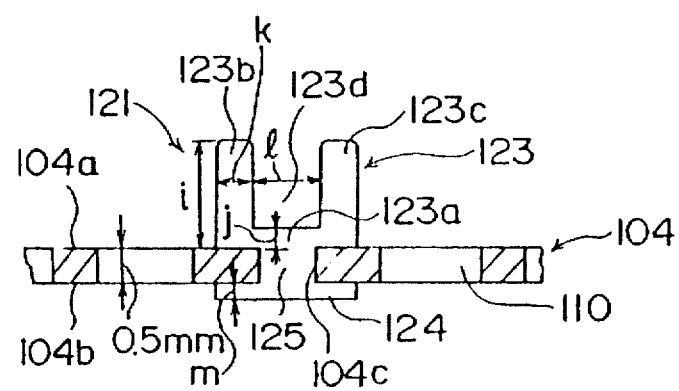
FIG. 11B is a cross-sectional view taken along line $III_B—III_B$ shown in FIG. 11A.
Figure 11C:
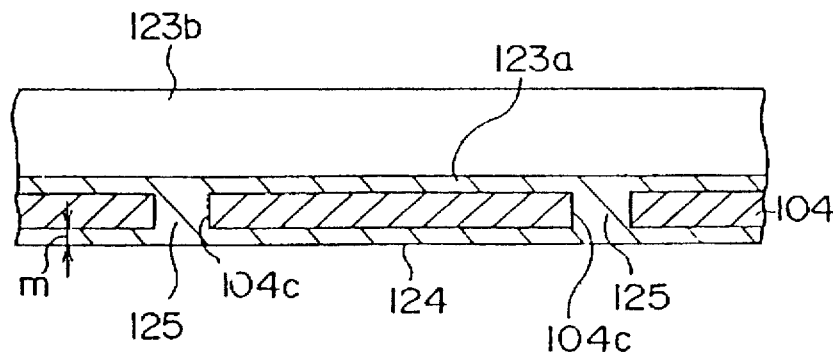
FIG. 11C is a cross-sectional view taken along line $III_C—III_C$ shown in FIG. 11A.

A structure of each of the first guide rails 121 is shown in FIGS. 11A, 11B and 11C. FIGS. 11B and 11C are respectively cross-sectional views along with lines III$_B$—III$_B$ and III$_C$—III$_C$ shown in FIG. 11A. Referring to FIGS. 11A, 11B and 11C, each of the first guide rails 121 is made of resin and has a guide rail body 123, a flat stopper portion 124 and connecting portions 125. The guide rail body 123 is on an inner surface 104a of the bottom plate 104. The flat stopper portion 124 is on an outer surface 104b of the bottom plate 104. The connecting portions 125 occupy holes 104c formed through the bottom plate 104 and connect the guide rail body 123 and the flat stopper portion 124. That is, the bottom plate 104 is put between the guide rail body 123 and the flat stopper portion 124, and each of the first guide rails 121 is integrated with the bottom plate 104.

The guide rail body 123 is formed of a bottom portion 123a and side walls 123b and 123c so as to have a U-shaped cross-section. A guide groove 123d is formed between the side walls 123b and 123c. Ends of the walls 123b and 123c of the guide rail body 123 which ends face the inlet 106 of the case unit 100 are cut diagonally so that an input portion 126 is formed at an end of the guide rail body 123.

Each of the second guide rails 122 has the same structure as each of the first guide rails 121 described above.

Each of the second guide rails 122 has the guide rail body 123 having the U-shaped cross-section. An end of the guide rail body 123 which end faces a corresponding one of the first guide rails 121 is cut diagonally so that an input portion 126 is formed at the end of the guide rail body 123.

Figure 12:
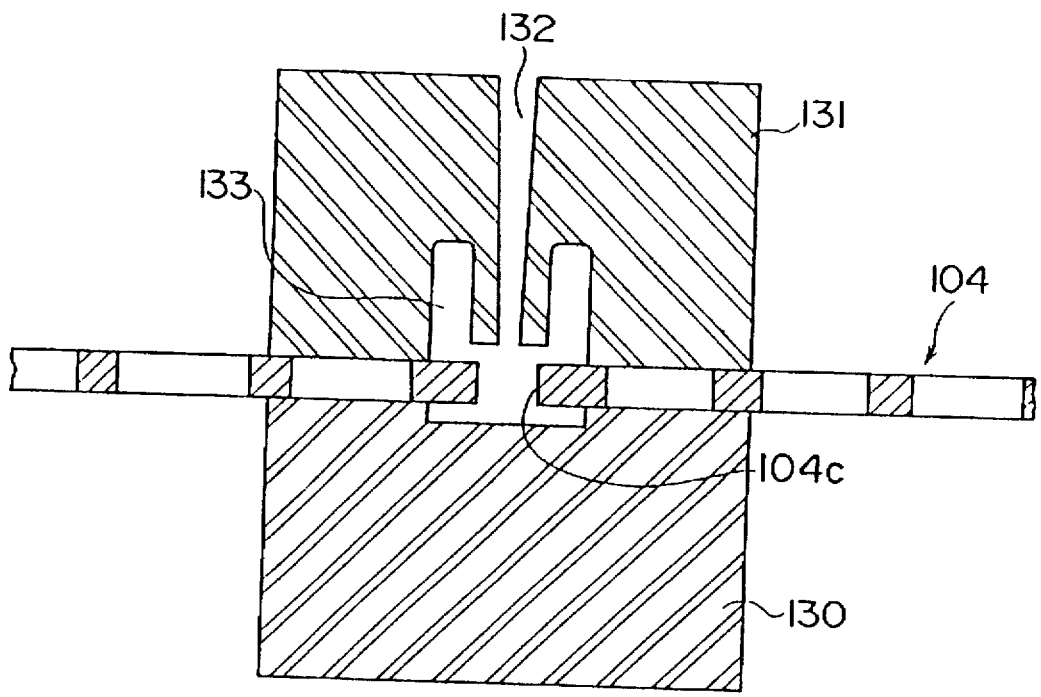
FIG. 12 is a cross-sectional view illustrating how to form a guide rail shown in FIGS. 10 and 11.

The guide rails 120 are integrated with the bottom plate 104 as shown in FIG. 12.

Referring to FIG. 12, the bottom plate 104 is set in between a lower die 130 and an upper die 131 in an injection molding machine. The lower die 130 and the upper die 131 are clamped together so that the holes 104c formed through the bottom plate 104 are located in a cavity 133 formed in the lower die 130 and the upper die 131 clamped together. The cavity 133 has an outline corresponding to the outline of each of the guide rails 120. Molten resin is injected into the cavity 133 through a gate 132, and the cavity 133 is filled with the molten resin. After a predetermined time elapses, the lower die 130 and the upper die 131 are separated. The guide rails 120 which are completely formed so as to be integrated with the bottom plate 104 are taken out from between the lower die 130 and the upper die 131.

Since the guide rails 120 are integrated with the bottom plate 104 in the injection molding process as has been described above, the guide rails 120 (including the first and second guide rails 121 and 122) are fixed on the bottom plate without looseness with a high accuracy.

Dimensions of respective parts of each of the guide rails 120 are indicated as follows.

i=3 mm
j=0.5 mm
k=1.5 mm
l=2 mm
m=0.5 mm where, as shown in FIG. 11B, i is the height of the guide rail body 123, j is the thickness of the bottom portion 123a of the guide rail body 123, k is the thickness of each of the walls 123b and 123c, l is the width of the guide groove 123d and m is the thickness of the flat stopper portion 124.

The top plate 103 is provided with the guide rails 120 in the same manner as the bottom plate 104 as has been described above.

Figure 13A:
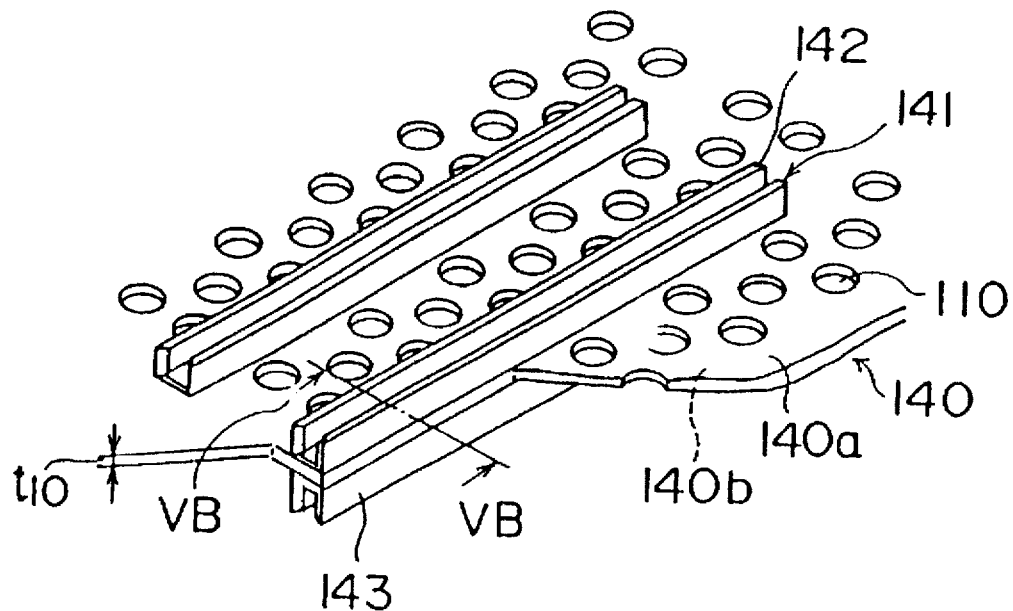
FIG. 13A is a diagram illustrating a part of a shelf plate shown in FIG. 9.
Figure 13B:
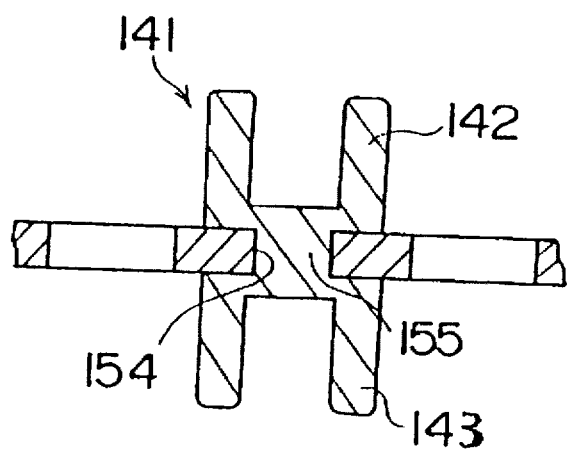
FIG. 13B is a cross-sectional view taken along line $V_B—V_B$ shown in FIG. 13A.

A structure of the shelf plate 109 is shown in FIGS. 13A and 13B.

Referring to FIGS. 13A and 13B, the shelf plate 109 is formed of a single metal plate 140. The single metal plate 140 is provided with guide rails 141. The metal plate 140 has a large number of air vents 110. Each of the guide rails 141 has an upper rail portion 142 which is on an upper side 140a of the metal plate 140, a lower rail portion 143 which is on a lower side 140b of the metal plate 140, and a connection portion 155 (see FIG. 13B). Each of the upper and lower rail portions 142 and 143 have the same dimensions as the guide rail body 123 shown in FIG. 10. The connection portions 155 occupy holes 154 formed in the metal plate 140 and connect the upper rail portion 142 and the lower rail portion 143. That is, the metal plate 140 (the shelf plate 109) is put between the upper rail portion 142 and the lower rail portion 143, and each of the guide rails 141 is integrated with the metal plate 140.

Figure 14:
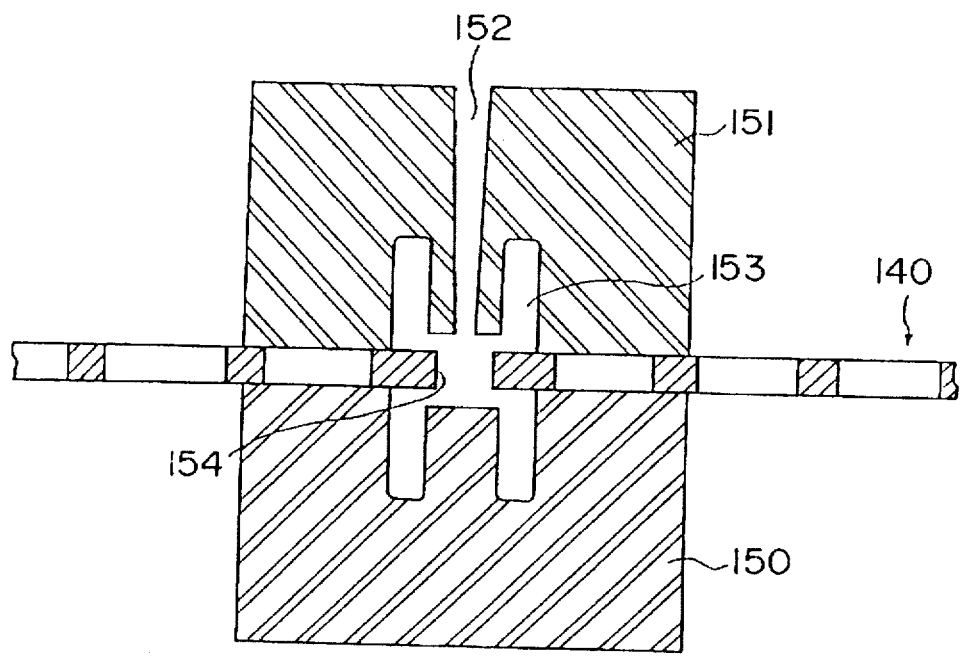
FIG. 14 is a cross-sectional view illustrating how to form a guide rail shown in FIG. 13A.

The guide rails 141 are integrated with the metal plate 140 (the shelf plate 109) as shown in FIG. 14.

Referring to FIG. 14, the metal plate 140 is set in between a lower die 150 and an upper die 151 in an injection molding machine. The lower die 150 and the upper die 151 are clamped together so that the holes 154 formed on the metal plate 140 are located in a cavity 153 formed in the lower die 150 and the upper die 151 clamped together. The cavity 133 has an outline corresponding to the outline of the upper rail portion 142 and the lower rail portion 143. Molten resin is injected into the cavity 153 through a gate 152, and the cavity 153 is filled with the molten resin. After a predetermined time elapses, the lower die 150 and the upper die 151 are separated. The guide rails 160 which are completely formed so as to be integrated with the metal plate 140 are taken out from between the lower die 150 and the upper die 151.

Figure 15:
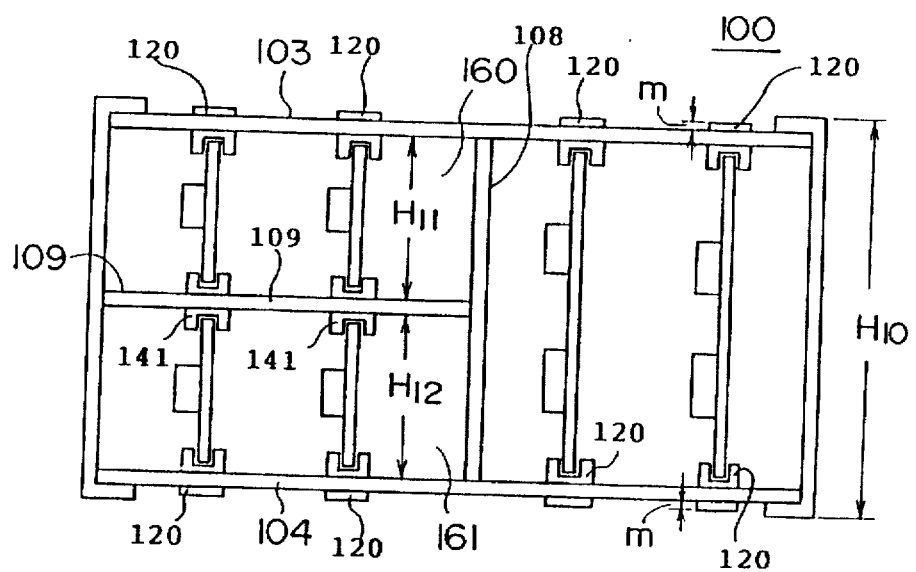
FIG. 15 is a front view illustrating the case unit shown in FIG. 9.

A plurality of printed-circuit assemblies 14c-1, 14c-2 and 14c-3 are inserted into the case unit 100 as shown in FIG. 9. The plurality of printed-circuit assemblies are then housed by the case unit 100 as shown in FIG. 15. Referring to FIG. 15, some of the printed-circuit assemblies are guided and supported by the guide rails 120 fixed on the top plate 103 and the bottom plate 104 in the right portion of the case unit 100. Some of the printed-circuit assemblies are guided and supported by the guide rails 120 fixed on the top plate 103 and the upper rail portions 142 of the guide rails 141 fixed on the shelf plate 109 in a space 160 between the top plate 103 and the shelf plate 109. In addition, some of the printed-circuit assemblies are guided and supported by the guide rails 120 fixed on the bottom plate 104 and the lower rail portions 143 of the guide rails 141 fixed on the shelf plate 109 in a space 161 between the bottom plate 104 and the shelf plate 109.

The case unit 100 in the first embodiment of the present invention, as has been described above, has the following advantages.

1) The case unit 100 has a height $H_{10}$ which can be lowered.

The guide rails 120 are integrated with the top plate 103 and the bottom plate 104 simultaneously with forming of the guide rails 120. Thus, the thickness m of the flat stopper portion 124 of each of the guide rails 120 can be small. That is, the projection upward from the top plate 103 and the projection downward from the bottom plate 104 can be small. In the first embodiment, the thickness m of the flat stopper portion 124 is 0.5 mm.

Figure 1:
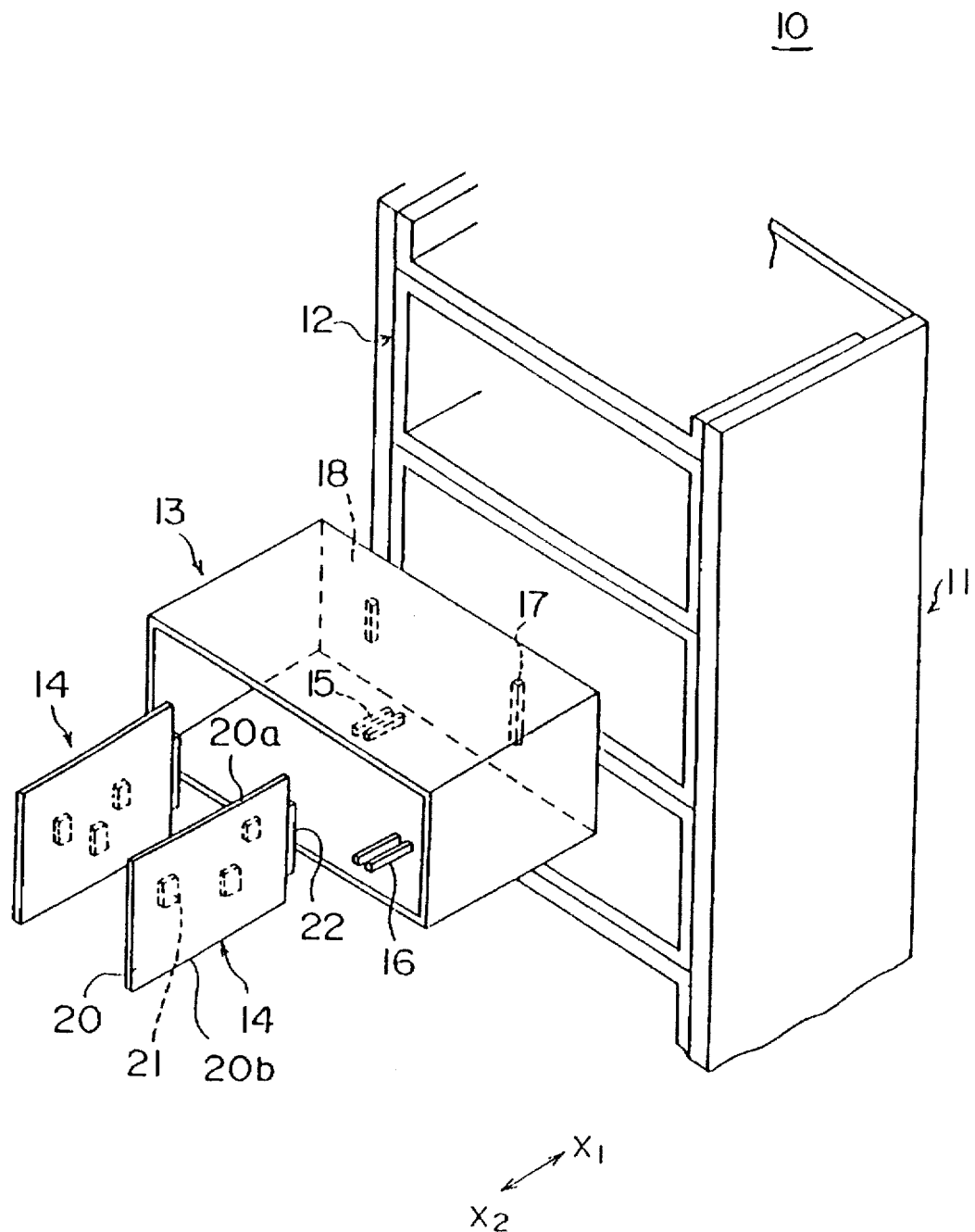
FIG. 1 is a diagram illustrating a frame apparatus provided with case units for housing printed-circuit assemblies according to the prior art.
Figure 2:
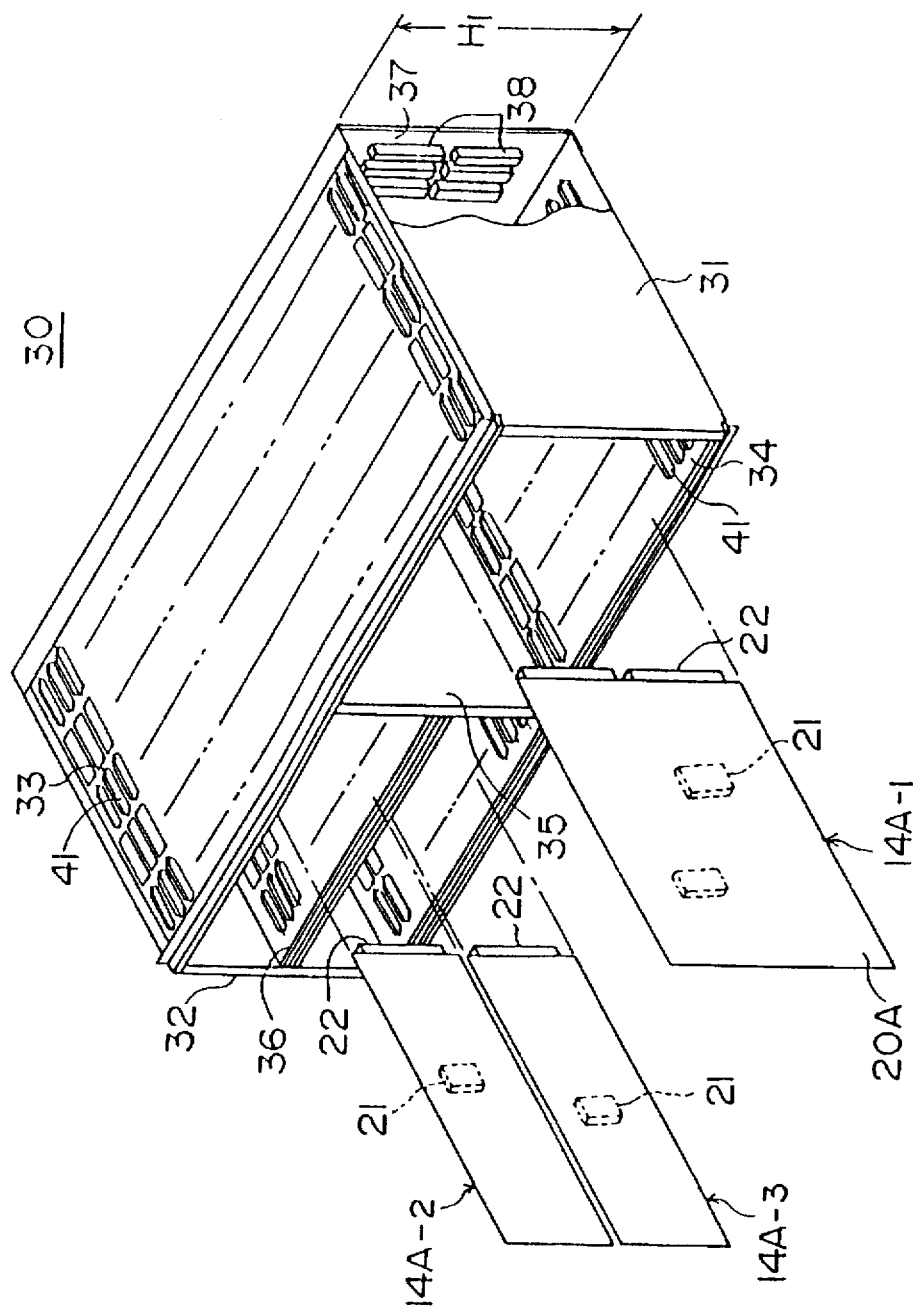
FIG. 2 is a diagram illustrating an example of a conventional case unit for housing printed-circuit assemblies.
Figure 3:
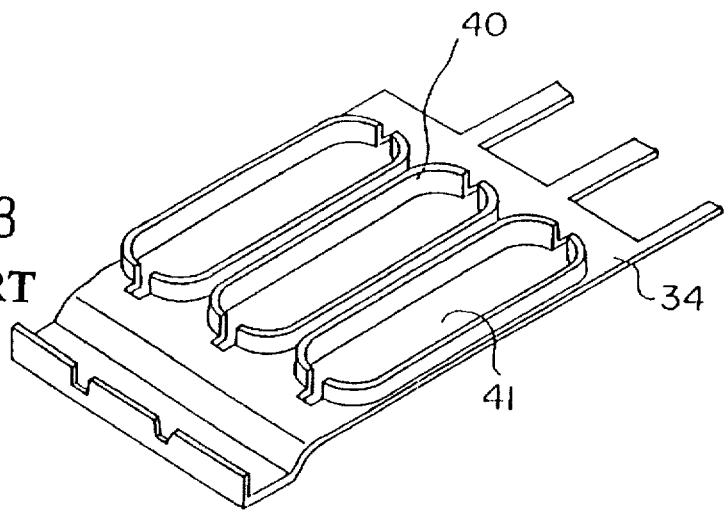
FIG. 3 is an enlarged perspective view illustrating a part of a bottom plate shown in FIG. 2.
Figure 4A:
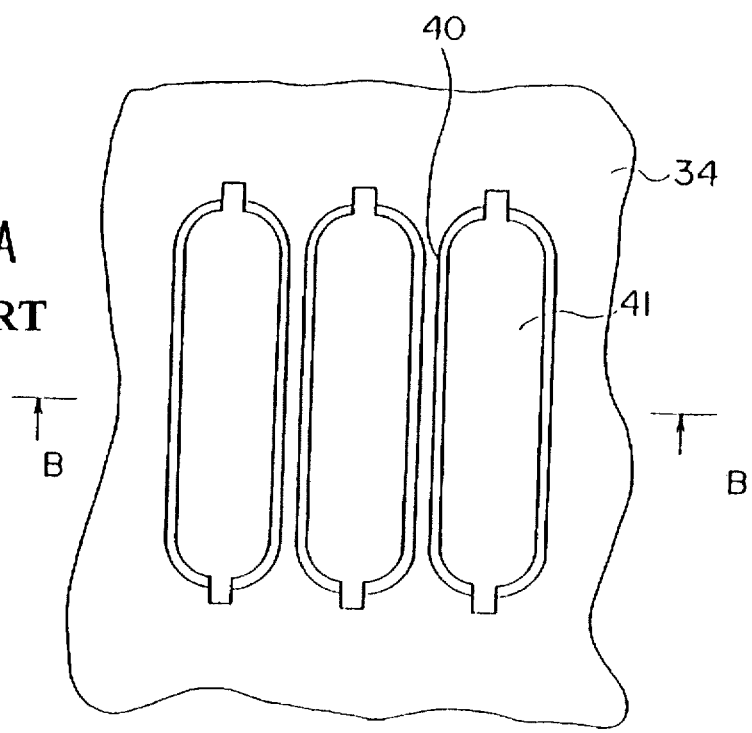
FIG. 4A is an enlarged diagram illustrating a part of the bottom plate shown in FIG. 2.
Figure 4B:
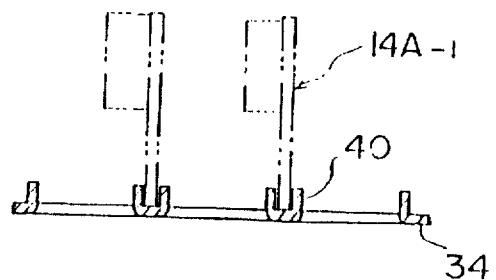
FIG. 4B is a cross-sectional view taken along line B—B shown in FIG. 4A.
Figure 5:
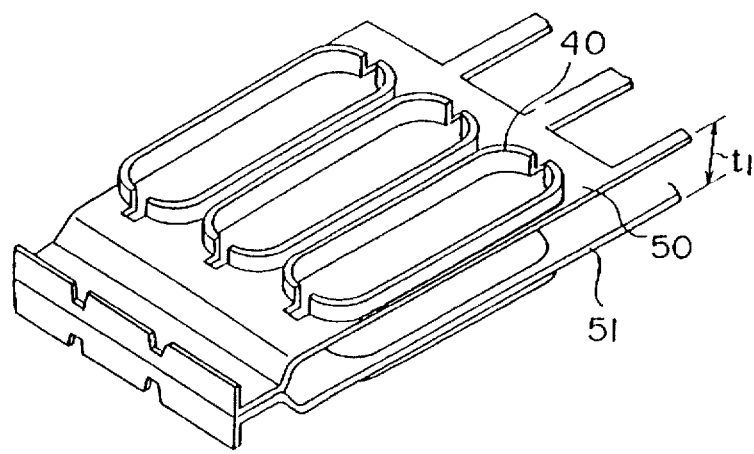
FIG. 5 is a enlarged diagram illustrating a part of a shelf plate shown in FIG. 2.
Figure 6:
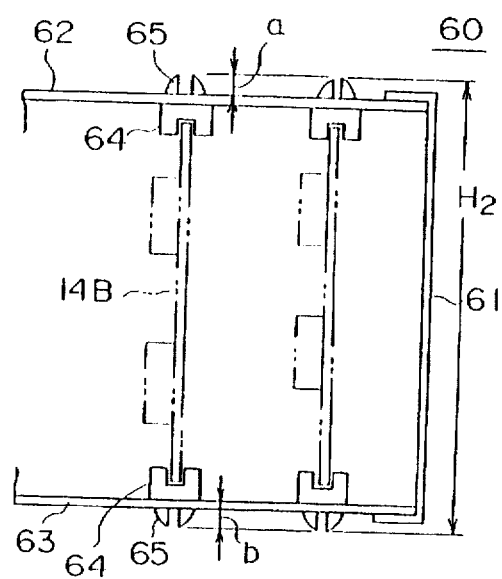
FIG. 6 is a diagram illustrating another example of a conventional case unit for housing printed-circuit assemblies.
Figure 7:
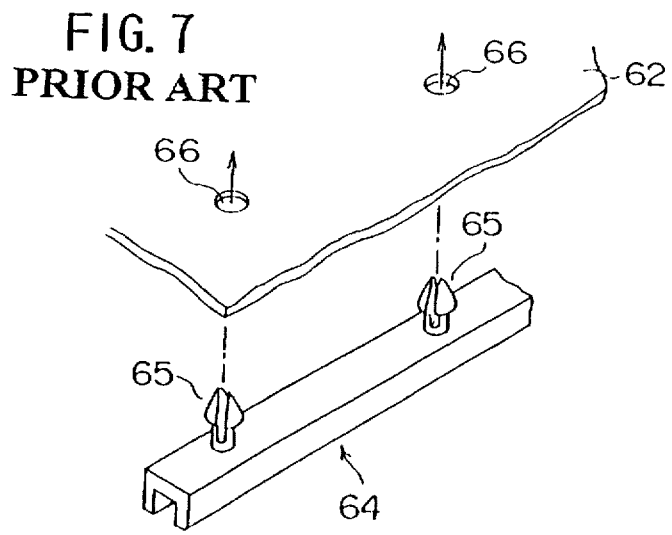
FIG. 7 is a diagram illustrating how to mount a guide rail on a top plate shown in FIG. 6.

Thus, the height $H_{10}$ of the case unit 100 is smaller than the height of the conventional case unit 30 shown in FIG. 2.

2) The space 160 between the shelf plate 109 and the top plate 103 and the space 161 between the bottom plate 104 and the shelf plate 109 can be broad (see FIG. 15).

The shelf plate 109 is formed of a single metal plate 140. Thus, the shelf plate 109 is thinner than the shelf plate 36 formed of two metal plates in the conventional case unit 30. As a result, a height $H_{11}$ of the space 160 and a height $H_{12}$ of the space 161 can be greater than those in the conventional case. The printed-circuit assembly having a size greater than that in the conventional case can be housed in the spaces 160 and 161.

3) The case unit 100 has an electromagnetic shield characteristic superior to that of the conventional case unit 30 shown in FIG. 2.

In the case unit 100 according to the first embodiment, the edges of each of the air vents 110 are not risen in order to form the guide rails. Thus, an area of each of the air vents 110 can be small. As a result, it is hard for an electromagnetic wave to pass through the air vents 110, so that the electromagnetic shield characteristics are improved.

(4) The printed-circuit assemblies can be smoothly loaded into the case unit 100 and stably maintained therein.

The guide rails 120 and 141 are integrated with the top plate 103, the bottom plate 104 and the shelf plate 109 (the metal plate 140) in the resin molding process, so that the guide rails 120 and 141 have a high rigidity and are accurately fixed on the respective plates. Thus, the printed-circuit assemblies can smoothly slid on the guide rails 120 and 141 into the case unit 100 and are stably maintained by the guide rails 120 and 141.

(5) The insulation bands are not needed to be formed on edge portions of the printed-circuit board.

Figure 8:
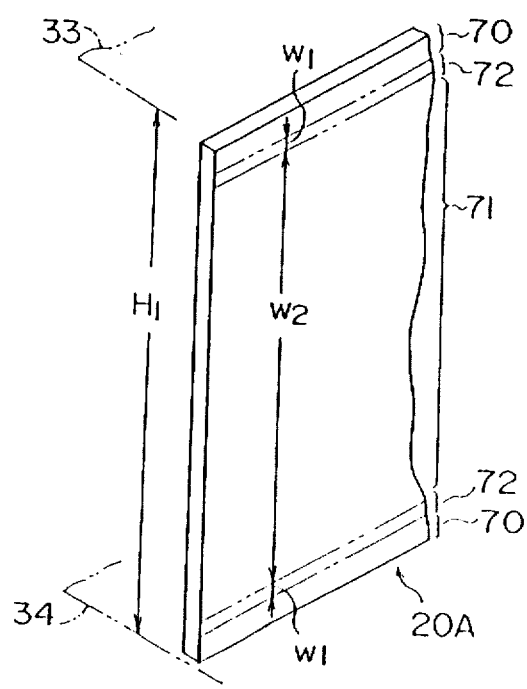
FIG. 8 is a diagram illustrating a printed-circuit board housed in the case unit shown in FIG. 2.

Since the guide rails 120 and 141 are made of resin, the insulation bands as shown in FIG. 8 are not needed to be formed on edge portions of the printed-circuit board of each of the printed-circuit assemblies. Thus, an area on which the printed-circuit pattern is formed on the printed-circuit board can be slightly broader than that of the printed-circuit board to be loaded in the conventional case unit 30 as shown in FIG. 2. In a case where a large number of printed-circuit assemblies can be loaded into the case unit 100, the total area on which printed-circuit patterns are formed on the printed-circuit boards housed in the case unit 100 can be large. Thus, the electronic circuits formed on the printed-circuit assemblies housed in the case unit 100 can have a higher performance than those formed on the printed-circuit assemblies housed in the conventional case unit 30 as shown in FIG. 2.

A description will now be given of variations of the guide rails fixed on the top plate 103 and the bottom plate 104.

Figure 16A:
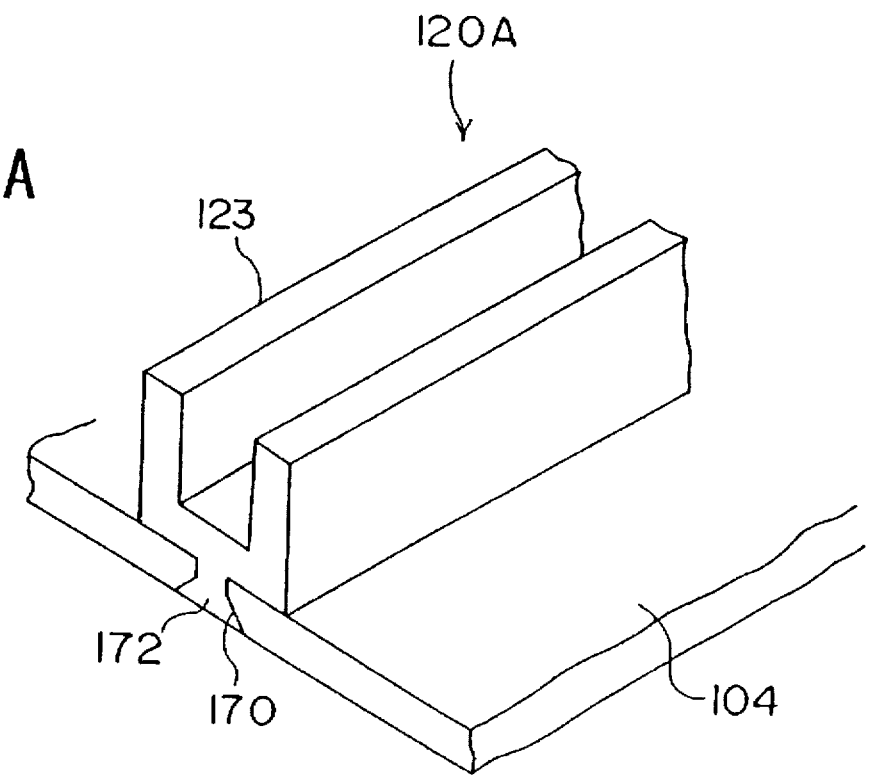
FIG. 16A is a perspective view illustrating a first variation of the guide rail fixed on the bottom plate.
Figure 16B:
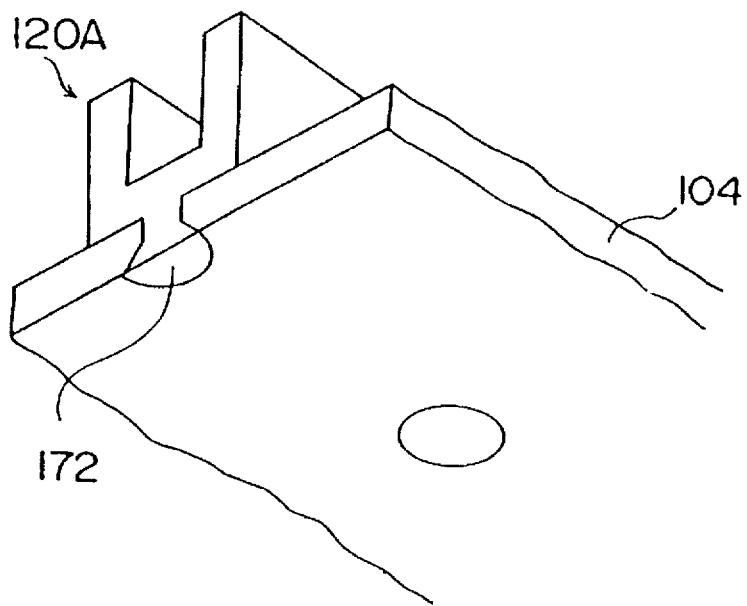
FIG. 16B is a perspective view illustrating a back of the bottom plate shown in FIG. 16A.

A first variation of the guide rail is shown in FIGS. 16A and 16B. Referring to FIGS. 16A and 16B, the bottom plate 104 has holes 170 each of which tapers from a side of the bottom plate 104 to an opposite side thereof. A guide rail 120A formed of the guide rail body 123 and tapered pins 172 is integrated with the bottom plate 104 in the resin molding process. In the resin molding process, the resin is injected into the holes 170, so that the tapered pins 172 connected to the guide rail body 123 are formed therein. The guide rail body 123 of the guide rail 120A is fixed on the bottom plate 104 by the tapered pins 172.

Figure 17A:
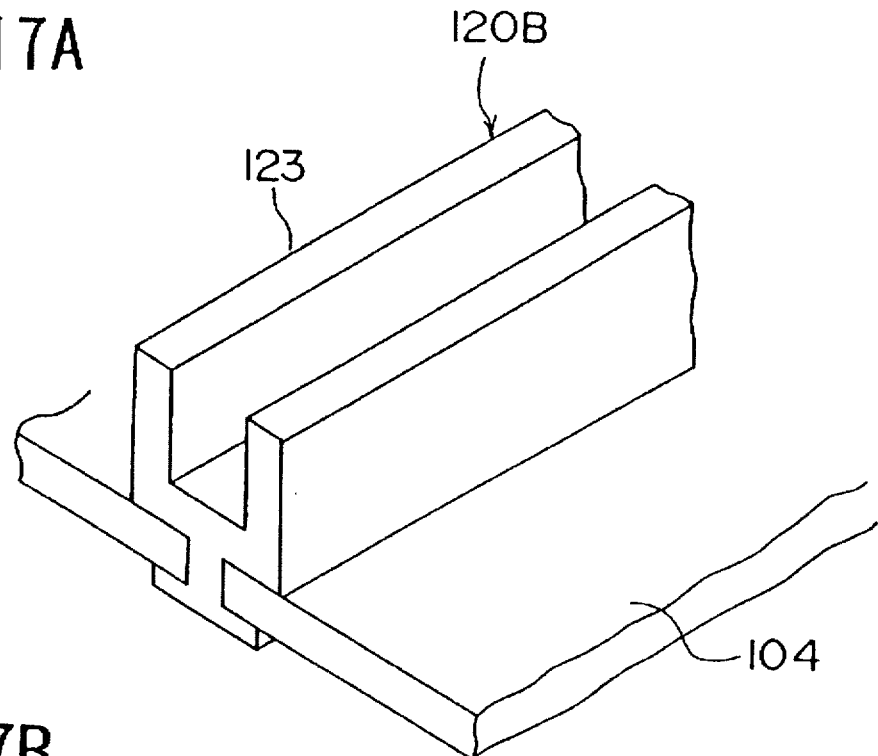
FIG. 17A is a perspective view illustrating a second variation of the guide rail fixed on the bottom plate.
Figure 17B:
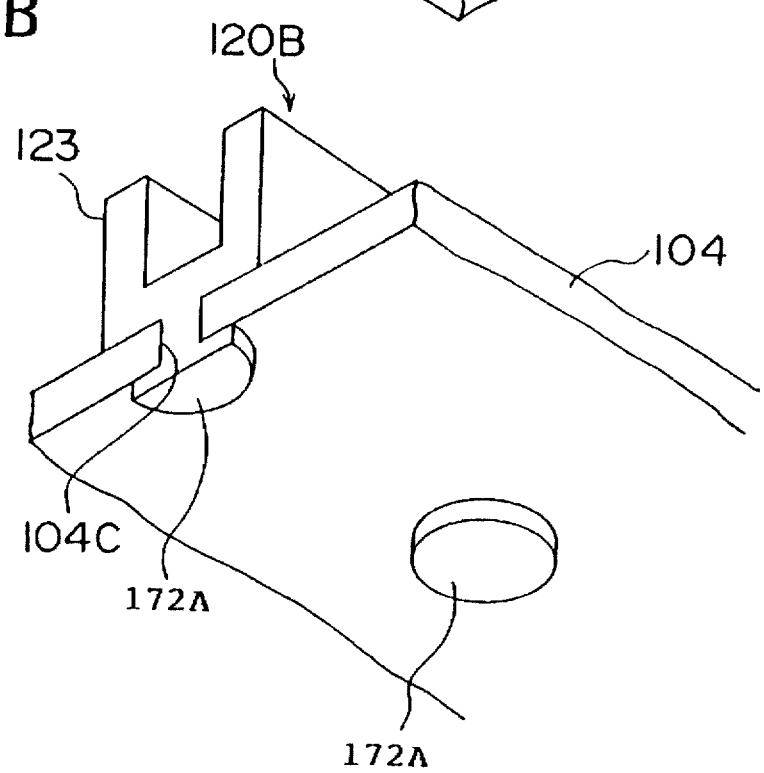
FIG. 17B is a perspective view illustrating a back of the bottom plate shown in FIG. 17A.

A second variation of the guide rail is shown in FIGS. 17A and 17B. Referring to FIGS. 17A and 17B, the bottom plate 104 has holes 104C. A guide rail 120B formed of the guide rail body 123 and flat-headed pins 172A is integrated with the bottom plate 104 in the resin molding process. In the resin molding process, the resin flows through the holes 104C so that the guide body 123 and the flat-headed pins 172A both of which are connected to each other are formed. The guide rail body 123 of the guide rail 120B is fixed on the bottom plate 104 by the flat-headed pins 172A.

Figure 18A:
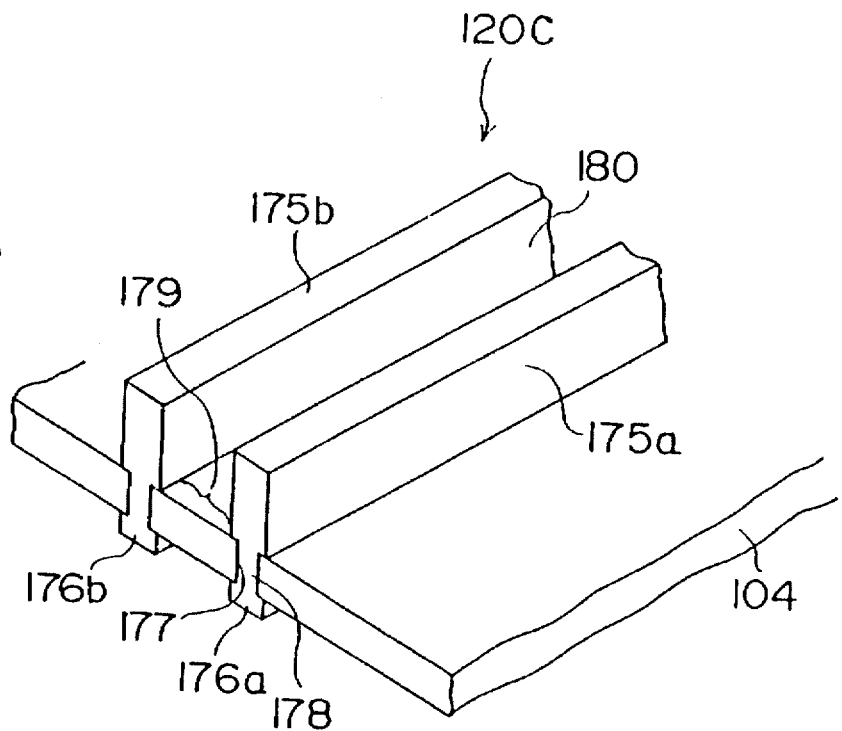
FIG. 18A is a perspective view illustrating a third variation of the guide rail fixed on the bottom plate.
Figure 18B:
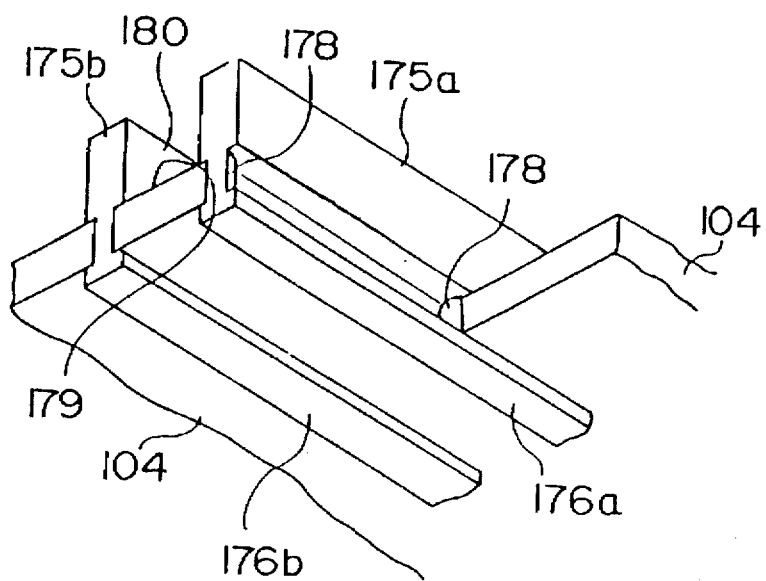
FIG. 18B is a perspective view illustrating a back of the bottom plate shown in FIG. 18A.

A third variation of the guide rail is shown in FIGS. 18A and 18B. Referring to FIGS. 18A and 18B, the bottom plate 104 has holes 177 arranged in two rows parallel to each other. A guide rail 120C is integrated with the bottom plate 104 in the resin molding process. In the resin molding process, the resin flows through the holes 177 so that ribs 175a and 175b are respectively connected to flat stopper portions 176a and 176b by connecting portions 178 located in the holes 177. The ribs 175a and 175b are fixed on the bottom plate 104 by the flat stopper portions 176a and 176b connected thereto by the connecting portions 178. The ribs 175a and 175b and a part of a surface of the bottom plate 104 which part is between the ribs 175a and 175b form a guide groove 180 of the guide rail 120C.

Figure 19A:
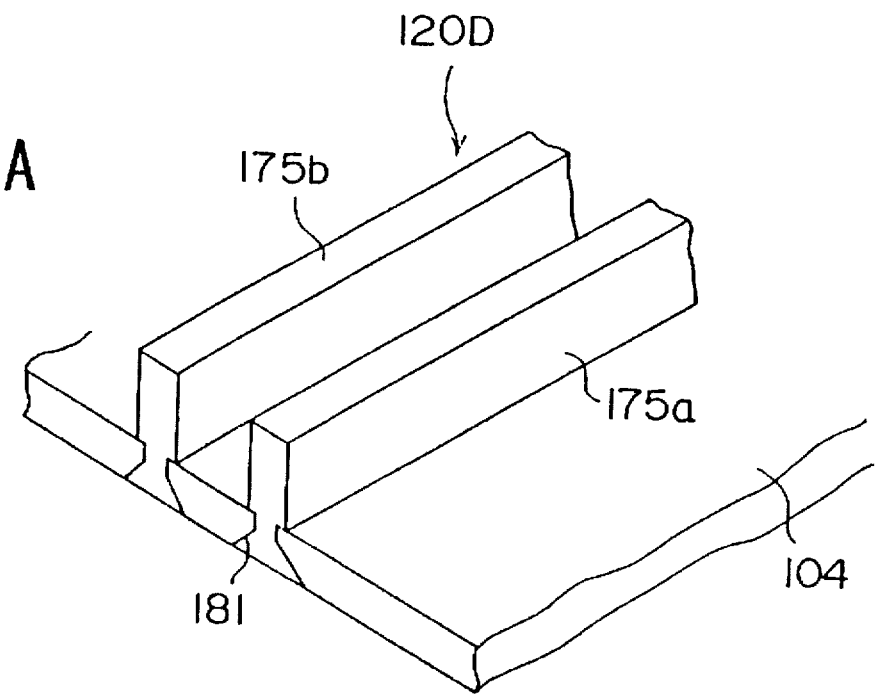
FIG. 19A is a perspective view illustrating a fourth variation of the guide rail fixed on the bottom plate.
Figure 19B:
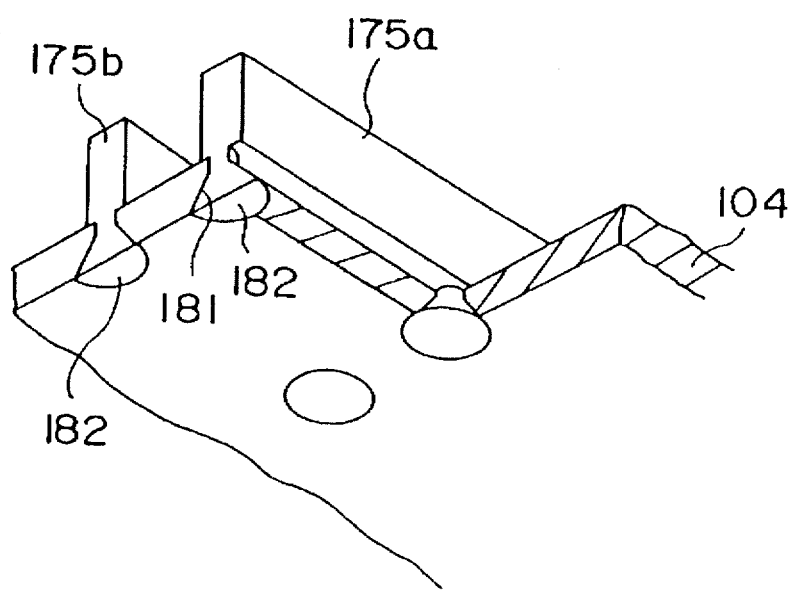
FIG. 19B is a perspective view illustrating a back of the bottom plate shown in FIG. 19A.

A fourth variation of the guide rail is shown in FIG. 19A and 19B. Referring to FIGS. 19A and 19B, the bottom plate 104 has holes 181 which taper from a side of the bottom plate 104 to an opposite side thereof. The holes 181 are arranged at predetermined intervals in two rows parallel to each other. A guide rail 120D is integrated with the bottom plate 104 in the resin molding process. In the resin molding process, the ribs 175a and 175b are formed of resin and tapered pins 182 connected to the ribs 175a and 175b are formed by the resin injected into the holes 181. The ribs 175a and 175b parallel to each other are fixed on the bottom plate 104 by the tapered pins 182. The ribs 175a and 175b and a part of the surface of the bottom plate 104 which part is between the ribs 175a and 175b form a guide groove of the guide rail 120D.

Figure 20A:
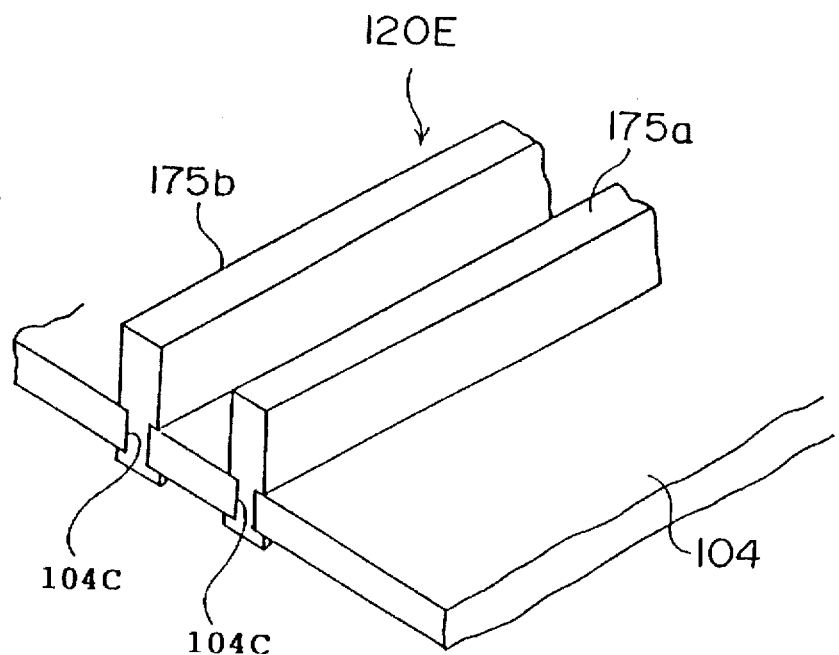
FIG. 20A is a perspective view illustrating a fifth variation of the guide rail fixed on the bottom plate.
Figure 20B:
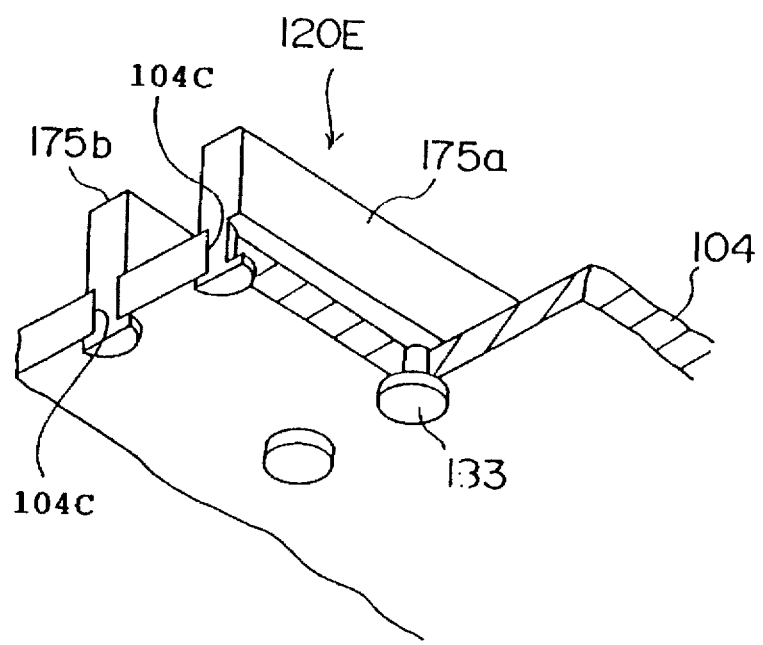
FIG. 20B is a perspective view illustrating a back of the bottom plate shown in FIG. 20A.

A fifth variation of the guide rail is shown in FIGS. 20A and 20B. Referring to FIGS. 20A and 20B, the bottom plate 104 has holes 104C which are arranged, at predetermined intervals in two rows parallel to each other. A guide rail 120E is integrated with the bottom plate 104 in the resin molding process. In the resin molding process, resin flows through the holes 104C so that the ribs 175a and 175b and flat-headed pins 183 connected to the ribs 175a and 175b are formed. The ribs 175a and 175b parallel to each other are fixed on the bottom plate 104 by the flat-headed pins 183. The ribs 175a and 175b and a part of the surface of the bottom plate 104 which part is between the ribs 175a and 175b form a guide groove of the guide rail 120E.

The tapered pins 172, 182 as shown in FIGS. 16A, 16B, 19A and 19B may be as follows.

Straight pins projecting from the guide rail body 123 and the ribs 175a and 175b are inserted into the corresponding holes 170 and 181 which are tapered. The straight pins are then softened by heat with pressure so that the holes 170 and 180 are filled with the softened resin. As a result, the tapered pins 172 and 182 are formed in the holes 170 and 181.

The flat-headed pins 172A and 183 as shown in FIGS. 17A, 17B, 20A and 20B may be formed as follows.

Straight pins projecting from the guide rail 123 and the ribs 175a and 175b are inserted into the corresponding holes 104C. Head portions of the straight pins projecting from the bottom plates 104 are then softened by heat with pressure until the softened head portions extend flat on the bottom plates 104. As a result, the flat-headed pins 172A and 183 connected to the guide rail body 123 and the ribs 175a and 175b through the holes 104C are formed.

A description will now be given, with reference to FIGS. 21A and 21B, of a variation of the guide rail fixed on the shelf plate 109.

Figure 21A:
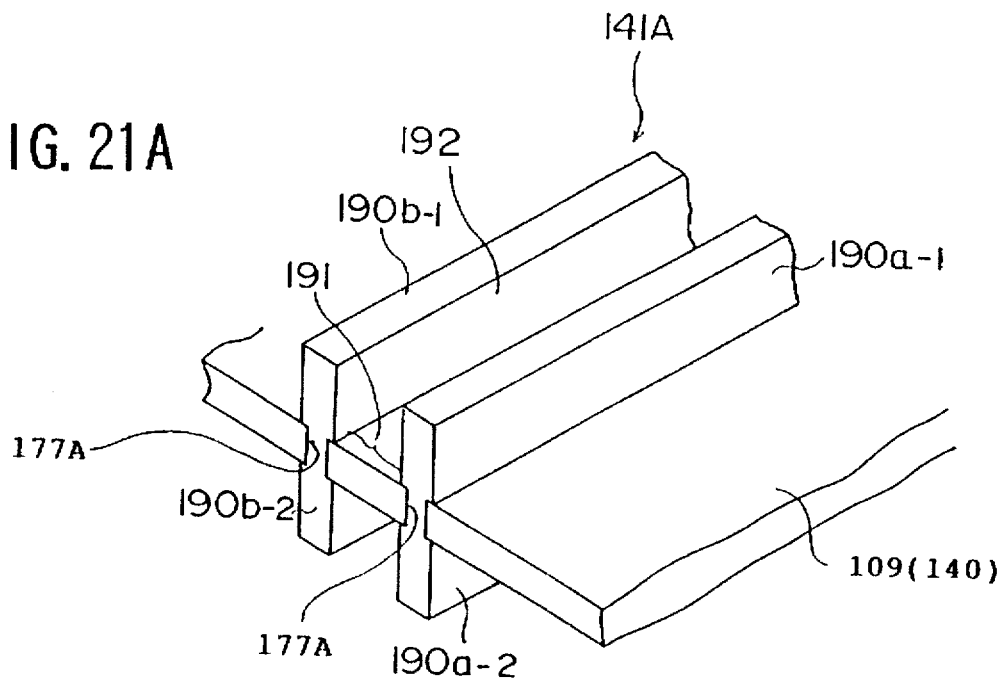
FIG. 21A is a perspective view illustrating a variation of a guide rail fixed on a shelf plate.
Figure 21B:
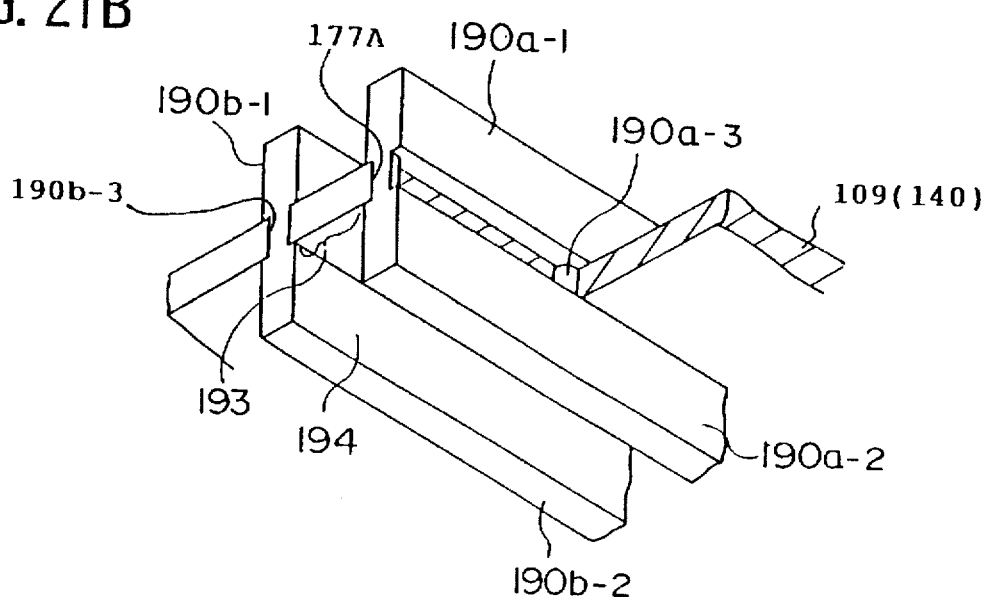
FIG. 21B is a perspective view illustrating a back of the shelf plate.

Referring to FIGS. 21A and 21B, the shelf plate 109 (the metal plate 140) has holes 177A arranged at predetermined intervals in two rows parallel to each other. A guide rail 141A is integrated with the shelf plate 109 (the metal plate 140) in the resin molding process. In the resin molding process, resin flows through the holes 177A so that ribs 190a-1 and 190b-1, both of which are projected from a side of the shelf plate 109, and ribs 190a-2 and 190b-2, both of which are projected from an opposite side of the shelf plate 109 are respectively connected by connection portions 190a-3 and 190b-3 located in the holes 177A. The ribs 190a-1 and 190b-1 are fixed on the shelf plate 109 by the ribs 190a-2 and 190b-2 connected to the ribs 190a-1 and 190b-1 by the connection portions 190a-3 and 190b-3 and vice versa. The ribs 190a-1 and 190b-1 and a part 191 of the side of the shelf plate 109, which part is between the ribs 190a-1 and 190b-1, form a first guide groove 192 of the guide rail 141A. The ribs 190a-2 and 190b-2 and a part 193 of the opposite side of the shelf plate 109 which part is between the ribs 190a-2 and 190b-2 form a second guide groove 194 of the guide rail 141A.

A description will now be given of a case unit according to a second embodiment of the present invention.

Figure 22:
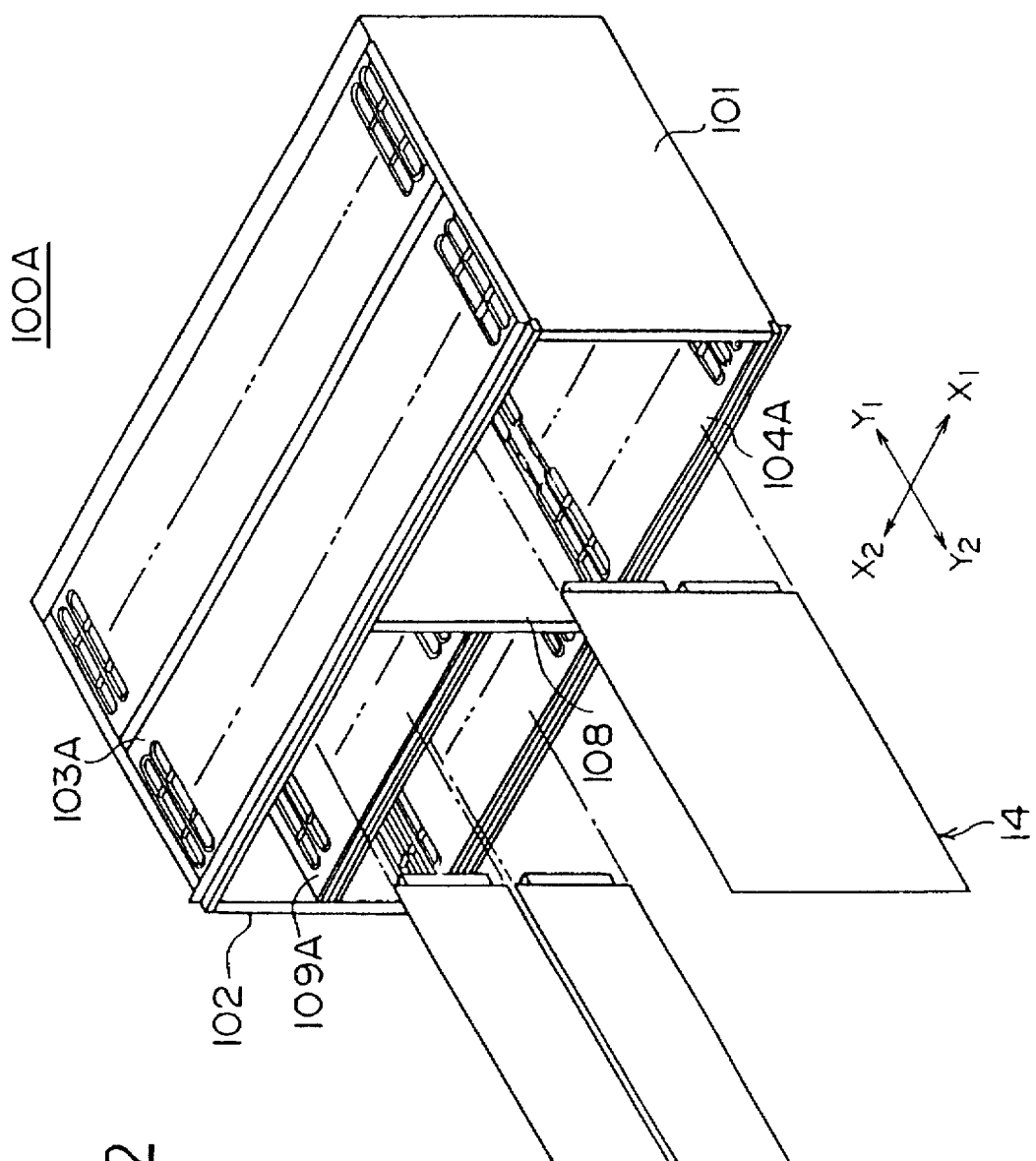
FIG. 22 is a perspective view illustrating a case unit according to a second embodiment of the present invention.

The case unit according to the second embodiment is shown in FIG. 22. In FIG. 22, those parts which are the same as those shown in FIG. 9 are given the same reference numbers.

Figure 23:
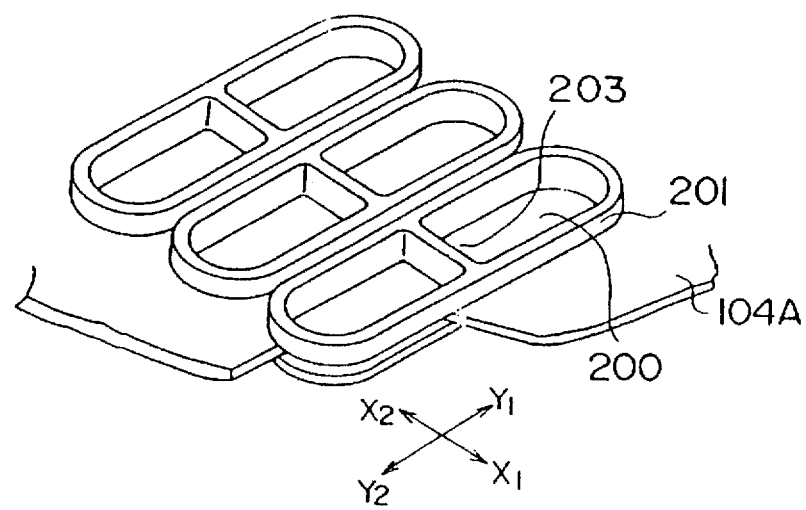
FIG. 23 is a diagram illustrating a part of a bottom plate shown in FIG. 22.
Figure 24A:
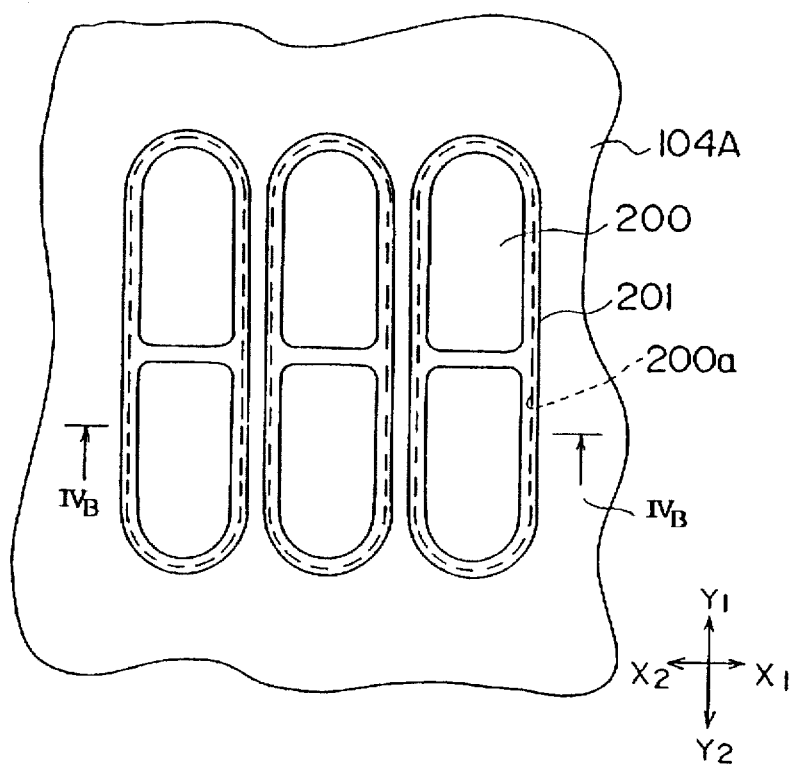
FIG. 24A is a plan view illustrating a part of the bottom plate shown in FIG. 22.

Referring to FIG. 22, the case unit 100A has side plates 101 and 102, a top plate 103A, a bottom plate 104A and a shelf plate 109A in the same manner as the case unit 100 shown in FIG. 9. The top plate 103A and the bottom plate 104A are provided with many air vents 200 which are wide holes as shown in FIGS. 23 and 24A. Each of the air vents 200 is lengthened in a direction Y1–Y2 so as to have a long axis parallel to the direction Y1–Y2 and a short axis parallel to a direction X1–X2 perpendicular to the direction Y1–Y2. The air vents 200 are arranged at predetermined intervals in the direction X1–X2. Ring-shaped ribs 201 are integrated with the bottom plate 104A in the resin molding process so as to cover edges 200a of the air vents 200. In order to prevent bending in each of the ring-shaped ribs 201, each of the ring-shaped ribs 201 has a crosspiece 203, as shown in FIG. 23, which extends from one side to another side in a direction parallel to the short axis.

Figure 24B:
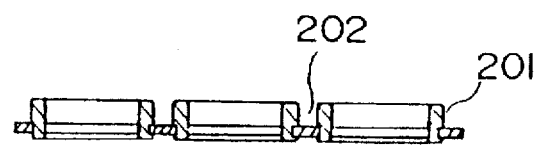
FIG. 24B is a cross-sectional view taken along line $IV_B—IV_B$ shown in FIG. 24A.
Figure 24C:
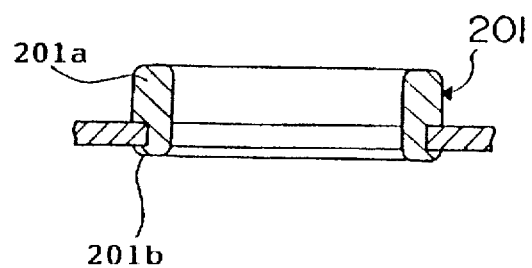
FIG. 24C is a cross-sectional view illustrating a rib shown in FIGS. 24A and 24B.

A cross section taken along a line IVB—IVB shown in FIG. 24A is shown in FIG. 24B, and an enlarged cross section of each ring-shaped rib 201 is shown in FIG. 24C. Referring to FIGS. 24B and 24C, each of the ring-shaped ribs 201 has a first projection portion 201a projecting from an inner surface of the bottom plate 104A and a second projection portion 201b projecting from an outer surface off the bottom plate 104A, the first portion 201a being longer than the second portion 201b. A guide groove 202 is formed between the first portions 201a of ring-shaped ribs 201 adjacent to each other.

The ring-shaped ribs 201 are integrated with the top plate 103A in the same manner as in the case of the bottom plate 104A so that guide grooves are formed on the inner surface of the top plate 103A.

Figure 25A:
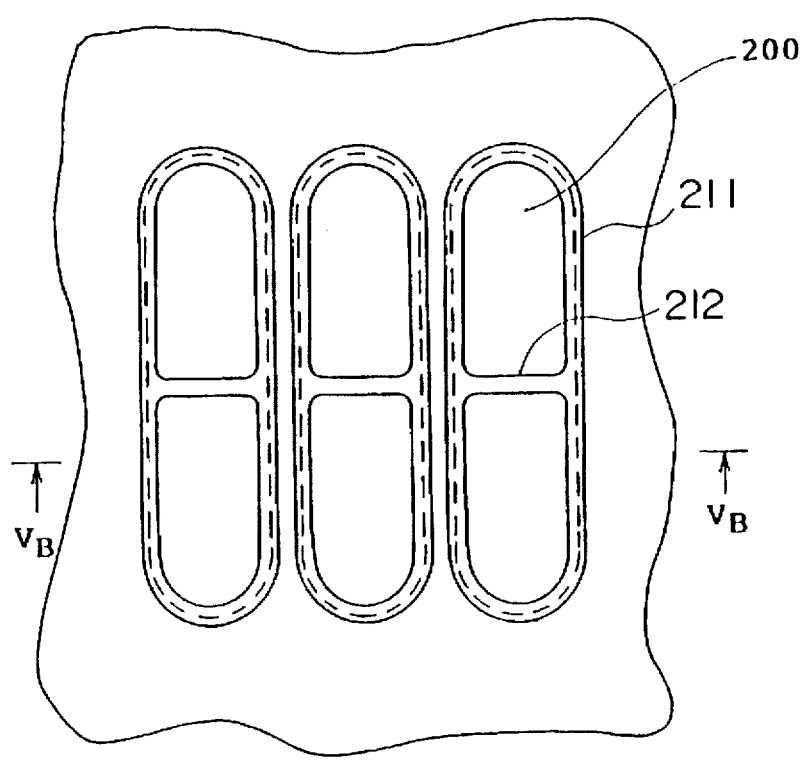
FIG. 25A is a plan view illustrating a part of a shelf plate shown in FIG. 22.
Figure 25B:
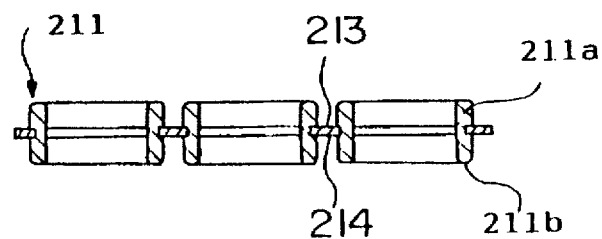
FIG. 25B is a cross-sectional view taken along line $V_B—V_B$ shown in FIG. 25A.
Figure 25C:
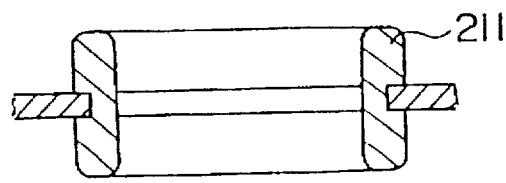
FIG. 25C is a cross-sectional view illustrating a rib shown in FIGS. 25A and 25B.

The shelf plate 109A is provided with the air vents 200 in the same manner as the top plate 103A and the bottom plate 104A. Ring-shaped ribs 211 are integrated with the shelf plate 109A so as to cover edges of the air vents 200, as shown in FIG. 25A. A cross section taken along a line VB—VB shown in FIG. 25A is shown in FIG. 25B. An enlarged cross section of a ring-shaped ring 211 is shown in FIG. 25C. Referring to FIGS. 25B and 25C, each of the ring-shaped ribs 211 has a first projection portion 211a projecting from an upper surface of the shelf plate 109A and a second projection portion 211b projecting from a lower surface of the shelf plate 109A. The first projection portion 211a is as long as the second projection portion 211b. Further, each of the ring-shaped ribs 211 has a crosspiece 212 which extends from one side to another side in a direction parallel to the short axis. A guide groove 213 is formed between the first projection portions of ring-shaped ribs 211 adjacent to each other on the upper surface of the shelf plate 109A. A guide groove 214 is formed between the second projection portions on ring-shaped ribs 211 adjacent to each other.

According to the case unit 100A according to the second embodiment of the present invention, the same advantages as in the first embodiment can be obtained.

Figure 26:
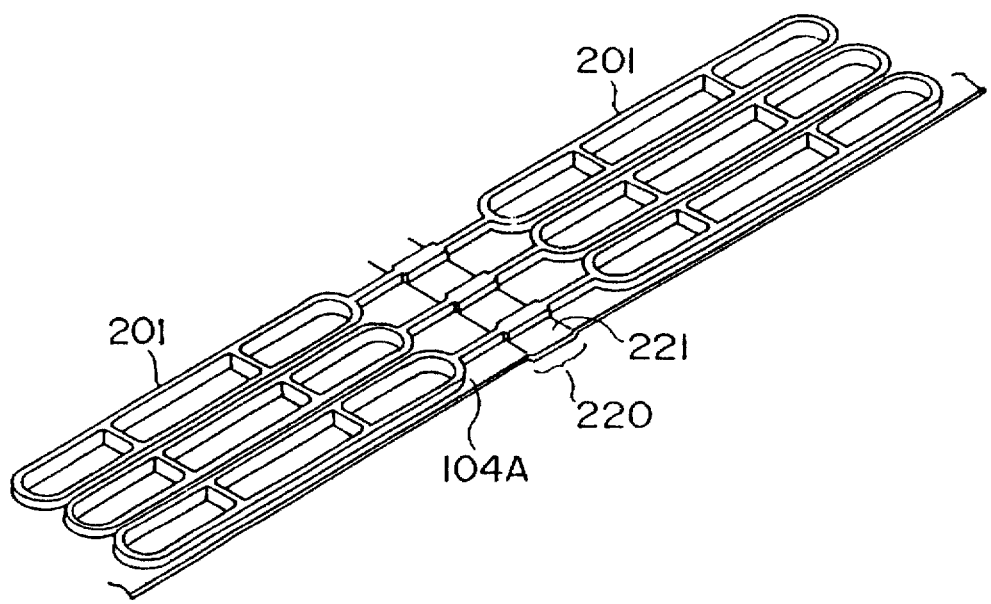
FIG. 26 is a perspective view illustrating the bottom plate on which ribs are formed.
Figure 27A:
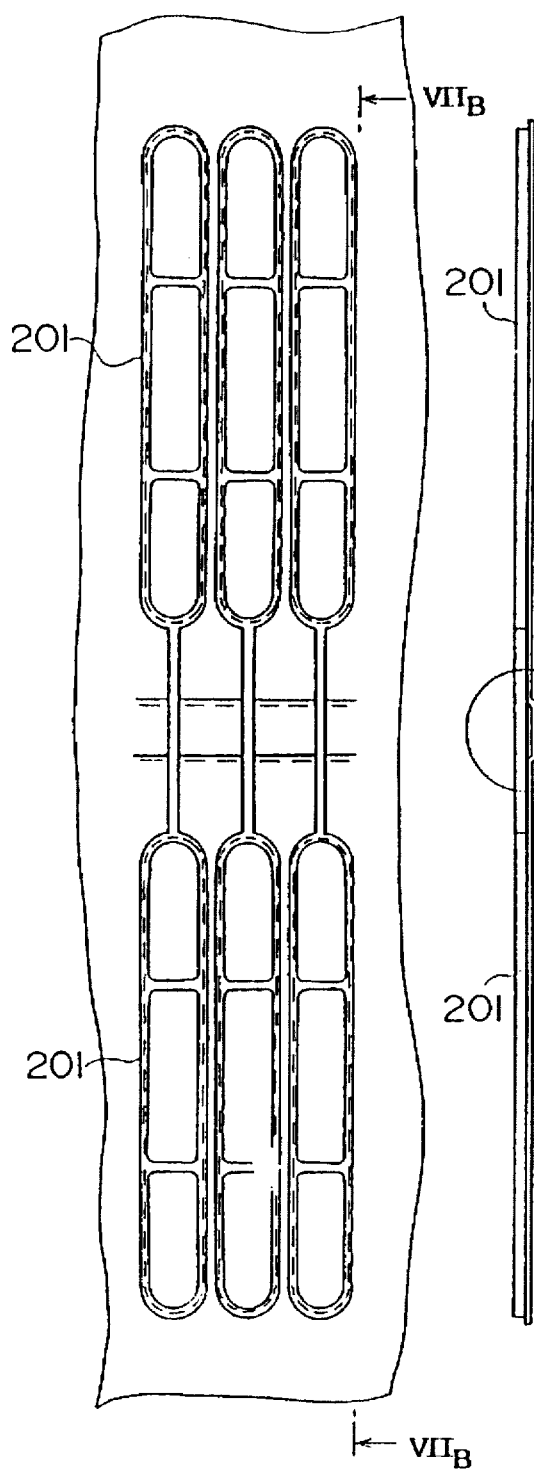
FIG. 27A is a plan view illustrating a structure of the bottom plate on which the ribs are formed.
Figure 27B:
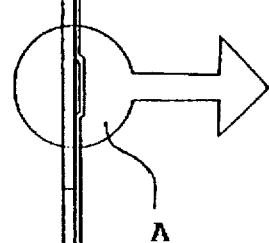
FIG. 27B is a cross-sectional view taken along line VII$_B$—VII$_B$ shown in FIG. 27A.
Figure 27C:
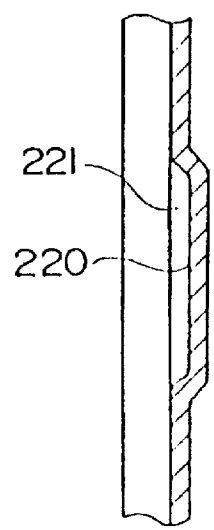
FIG. 27C is an enlarged diagram illustrating a part of the bottom plate in an area A shown in FIG. 27B.

The ring-shaped ribs 201 (or 211) are formed on the bottom plate 104A or the top plate 103A (or the shelf plate 109A) by the resin molding process as follows, as shown in FIGS. 26, 27A, 27B and 27C. FIG. 27B is a cross sectional view taken along line VIIB—VIIB shown in FIG. 27A, and FIG. 27C shows an enlarged part included in an area A shown in FIG. 27.

Referring to FIGS. 27A, 27B and 27C, a shallow groove 220 is formed on the bottom plate 104A (or the top plate 103A or the shelf plate 109A) by a press forming process. The shallow groove 220 extends in the direction X1–X2.

The bottom plate 104A is set between an upper die and a lower die in a resin molding machine, and the upper die and the lower die are then clamped together. In the upper die and the lower die clamped together, the shallow groove 220 formed on the bottom plate 104A functions as a part of a runner through which molten resin flows. The molten resin is injected into cavities corresponding to the ring-shaped ribs through the runner. The cavities are then filled with the molten resin. When the molding process is completed, the upper die and the lower die are separated from each other. A product as shown in FIG. 26 is then taken out between the upper die and the lower die. Referring to FIG. 26, the ring-shaped ribs 201 which are connected to a connection portion 221 corresponding to the runner are formed on the bottom plate 104A.

According to the resin molding process, all the ring-shaped ribs 201 (211) can be integrated with the bottom plate 104A (or the top plate 103A or the shelf plate 109A) by a one-shot operation in the molding machine.

The present invention is not limited to the aforementioned embodiments, and variations and modifications may be made without departing from the scope of the claimed invention.

What is claimed is:

1. A case unit for housing printed-circuit assemblies, said case unit comprising:

a top plate made of metal;

a bottom plate, made of metal, facing said top plate;

side plates facing each other, said side plates being positioned between side portions of said top plate and said bottom plate so that a space surrounded by said top plate, said bottom plate and said side plates is formed; and guide rails, made of resin, integrated with said top plate and said bottom plate, said guide rails guiding said printed-circuit assemblies loaded into said space, each of guide rails integrated with at least one of said top plate and said bottom plate having;

a guide rail body for guiding an edge of a printed-circuit assembly, said guide rail body being provided on an inner surface of a corresponding plate which is said top plate or said bottom plate;

a flat member provided on an outer surface of said corresponding plate; and connecting portions which fill mounting holes formed through said corresponding plate, said connecting portions connecting said guide rail body and said flat member and said flat member being to extend over and entirely overlap a whole edge of each of said mounting holes at a side of said corresponding plate opposite to said guide rail body, so that said guide rail body is fixed on said corresponding plate by said connecting portions and said flat member.

2. The case unit as claimed in claim 1, wherein said guide rails are integrated with said corresponding plate in a resin molding process.

3. A case unit for housing printed-circuit assemblies, said case unit comprising:

a top plate made of metal;

a bottom plate, made of metal, facing said top plate;

side plates facing each other, said side plates being positioned between side portions of said top plate and said bottom plate so that a space surrounded by said top plate, said bottom plate and said side plates is formed;

a shelf plate, made of metal, located between said top plate and said bottom plate so as to divide said space into an upper space and a lower space;

first guide rails, made of resin, integrated with said top plate and said bottom plate; and second guide rails, made of resin, integrated with said shelf plate, each of said second guide rails having:

an upper guide rail body provided on a first surface of said shelf plate, said upper guide rail body and at least one of said first guide rails integrated with said top plate guiding a printed-circuit assembly loaded into said upper space;

a lower guide rail body provided on a second surface of said shelf plate, said lower guide rail body and at least one of said first guide rails integrated with said bottom plate guiding a printed-circuit assembly loaded into said lower space; and connection portions which fill mounting holes formed through said shelf plate, said connecting portions connecting said upper guide rail body and said lower guide rail body and at least one of said upper guide rail body and said lower guide rail body being formed to extend over and entirely overlap a whole edge of each of said mounting holds at a side of said shelf plate opposite to another of said lower guide rail body and said upper guide rail body, so that said upper guide rail body and said lower guide rail body are fixed on said shelf plate.

4. The case unit as claimed in claim 3, wherein said second guide rails are integrated with said shelf plate in a resin molding process.

5. A case unit for housing printed-circuit assemblies, said case unit comprising:

a top plate made of metal;

a bottom plate, made of metal, facing said top plate;

side plates facing each other, said side plates being positioned between side portions of said top plate and said bottom plate so that a space surrounded by said top plate, said bottom plate and said side plates is formed; and guide rails, made of resin, integrated with said top plate and said bottom plate, said guide rails guiding said printed-circuit assemblies loaded into said space, each of guide rails integrated with at least one of said top plate and said bottom plate in a resin molding process, and including an upper guide rail body, a lower guide rail body and connecting portions extending into and occupying mounting holes formed through a corresponding plate, at least one of said upper guide rail body and said lower guide rail body covering a whole edge of each of said mounting holes.

6. A case unit for housing printed-circuit assemblies, said case unit comprising:

a top plate made of metal;

a bottom plate, made of metal, facing said top plate;

side plates facing each other, said side plates being positioned between side portions of said top plate and said bottom plate so that a space surrounded by said top plate, said bottom plate and said side plates is formed;

a shelf plate, made of metal, located between said top plate and said bottom plate so as to divide said space into an upper space and a lower space;

first guide rails, made of resin, integrated with said top plate and said bottom plate; and second guide rails, made of resin, integrated with said shelf plate, each of said second guide rails being a one-piece having:

an upper guide rail body provided on a first surface of said shelf plate, said upper guide rail body and at least one of said first guide rails integrated with said top plate guiding a printed-circuit assembly loaded into said upper space;

a lower guide rail body provided on a second surface of said shelf plate, said lower guide rail body and at least one of said first guide rails integrated with said bottom plate guiding a printed-circuit assembly loaded into said lower space, and connecting portions extending through said shelf plate and connecting said upper guide rail body to said lower guide rail body so that said second guide rails each is fixed on said shelf plate, wherein said second guide rails are integrated with said shelf plate by resin molding.

* * * * *